(12) United States Patent  (10) Patent No.: US 8,744,617 B2
Jin et al.  (45) Date of Patent: Jun. 3, 2014

(54) COMPONENT PANE HANDLER CONFIGURED TO HANDLE COMPONENT PANES OF MULTIPLE SIZES

(75) Inventors: Jian Ping Jin, Singapore (SG); Lee Kwang Heng, Singapore (SG)

(73) Assignee: Semiconductor Technologies & Instruments Pte Ltd, Singapore (SG)

( * ) Notice: Subject to any disclaimer, the term of this patent is extended or adjusted under 35 U.S.C. 154(b) by 74 days.

(21) Appl. No.: 13/470,364

(22) Filed: May 14, 2012

(65) Prior Publication Data

US 2012/0288353 A1  Nov. 15, 2012

(30) Foreign Application Priority Data

May 12, 2011 (SG) ................ 201103422-0

(51) Int. Cl.
  *G06F 7/00* (2006.01)
(52) U.S. Cl.
  USPC ........... 700/218; 700/213; 700/219; 700/220; 700/228
(58) Field of Classification Search
  None
  See application file for complete search history.

(56) References Cited

U.S. PATENT DOCUMENTS

| 2002/0089655 A1* | 7/2002 | Kida et al. | 355/72 |
| 2009/0051370 A1* | 2/2009 | Doki et al. | 324/658 |
| 2010/0130105 A1* | 5/2010 | Lee | 451/41 |
| 2010/0329827 A1* | 12/2010 | Hoey et al. | 414/217 |

* cited by examiner

*Primary Examiner* — Yolanda Cumbess
(74) *Attorney, Agent, or Firm* — Horizon IP Pte Ltd

(57) ABSTRACT

A component pane handling apparatus configured to handle component panes of multiple different sizes is disclosed. The apparatus includes at least one component pane capture element that can be displaced between a number of different positions, each position corresponding to a particular component pane size. Therefore, the at least one component pane capture element can be positioned to different positions for allowing handling of component panes of corresponding sizes. The apparatus also includes a position alignment mechanism configured to control displacement of the at least one component pane capture element to the different positions. The apparatus can also include one displacement arm coupled to the component pane capture element. The displacement of the component pane capture element can be effectuated by a displacement of at least a portion of the displacement arm. A method for handling component panes of multiple sizes is also included in this disclosure.

25 Claims, 12 Drawing Sheets

COMPONENT PANE HANDLER CONFIGURED TO HANDLE COMPONENT PANES OF MULTIPLE SIZES

TECHNICAL FIELD

The present disclosure relates generally to component pane handlers (or component pane handling apparatuses or devices) that are configured to handle, capture, hold, retrieve, or carry component panes, for example wafers, film frames or solar cell panels, of different sizes. More specifically, the component pane handlers of the present disclosure include at least one carrier or capture element configured to handle, capture, hold, retrieve, or carry component panes, said at least one carrier or capture element displaceable between a number of adjustable, selectable, or predetermined positions for handling, capturing, holding, retrieving, or carrying component panes of different or variable sizes.

BACKGROUND

The increasing global demand for semiconductor components and electronic products has led to significant advances in the methods, systems, devices, and techniques for manufacturing such semiconductor components and electronic products. Systems and devices for manufacturing (e.g., systems and devices for handling, packaging, and/or processing) semiconductor components that are capable of delivering higher efficiency or throughput are in demand. In addition, improvements (e.g., higher accuracy and increased speed) associated with methods and systems for inspecting semiconductor components are also valued in the semiconductor industry.

There are many different processes involved in semiconductor component manufacturing. The manufacture of a typical semiconductor component often involves multiple process steps or portions, including fabrication, processing, testing, inspection, and packaging. Typically, each of the multiple process steps or portions required for semiconductor component manufacturing occurs at different stations or locations (e.g., fabrication station, processing station, inspection station, and packaging station). Accordingly, semiconductor components will generally need to be transferred between different stations or locations during their manufacturing process.

Generally, semiconductor component handling apparatuses or devices (e.g., wafer handling apparatuses and film frame handling apparatuses) are used for handling semiconductor components and transferring said semiconductor components between different stations or locations. Many conventional semiconductor component handling apparatuses includes a gripper or gripper-type mechanism or arm configured to capture, hold, or carry semiconductor components. However, the use of gripper-type mechanisms or arms can be associated with structural and/or operational limitations. For instance, the use of gripper-type mechanisms for capturing, holding, or carrying semiconductor components can cause damage or deformation to the semiconductor components, particularly when undue gripping force is used for capturing, holding, or carrying said semiconductor components. In addition, each gripper-type mechanism is typically configured to capture, hold, or carry semiconductor components of one particular size.

In relation to the use of semiconductor component handling apparatuses for transferring film frames onto vacuum tables for further processing (e.g., optical inspection), the use of gripper-type mechanisms or arms for capturing, holding, and transferring film frames onto vacuum tables typically necessitates a presence and use of ejector pins by the vacuum table for receiving film frames from the semiconductor component handling apparatuses. However, the use of ejector pins is associated with limitations and disadvantages, including an increased vacuum table manufacturing and/or operating costs. In addition, ejector pins typically introduce gaps or openings on the vacuum table, thereby reducing the suction capability and/or vacuum uniformity on one or more portions of the vacuum table. In addition, when not properly (e.g., fully) retracted into the vacuum table, the ejector pins can cause unwanted damage or defects to the film frames (or to the semiconductor components carried by the film frames).

Film frames carrying semiconductor components can be of different sizes (e.g., diameters). For instance, common film frame sizes include 6 inch (150 mm), 8 inch (200 mm), and 12 inch (300 mm). Film frames are correspondingly sized for carrying a particular size of wafer (or particular type of semiconductor component), and have a larger overall diameter than the wafer (or semiconductor component) for which the film frame is configured to carry. More particularly, film frames include a metal or plastic ring or border that is configured to support a polymer film or tape. A wafer (e.g., a whole or diced wafer) can be carried by the polymer film, for instance, in a centrally disposed manner relative to the film frame ring.

The existence of film frames of different sizes results in a need for film frame handling apparatuses capable of capturing, holding, carrying, and/or transferring said film frames of different sizes. Many existing film frame handling apparatuses have limitations, disadvantages, and/or problems, for instance the need for significant or time consuming manual modification before being able to capture, hold, or carry film frames of different sizes. Accordingly, new, modified, and/or improved film frame handling apparatuses for handling, capturing, carrying, holding, and/or transferring film frames are required.

SUMMARY

In accordance with a first aspect of the present disclosure, there is disclosed an apparatus that includes at least one component pane capture element configured to capture a component pane. The at least one component pane capture element is displaceable between a first position corresponding to a first component pane size and a second position corresponding to a second component pane size, the second component pane size different from the first component pane size. The apparatus also includes a position control mechanism coupled to the at least one component pane capture element, wherein the position control mechanism is configured to control the displacement of the at least one component pane capture element between the first position and the second position to thereby allow handling of component panes of the first component pane size and the second component pane size respectively.

In accordance with a second aspect of the present disclosure, there is disclosed an apparatus for handling component panes, the apparatus comprising a plurality of component pane capture elements configured to capture component panes, the plurality of component pane capture elements displaceable between a plurality of positions corresponding to a plurality of different component pane sizes. The apparatus also includes a plurality of displacement arms, each component pane capture element of the plurality of component pane capture elements carried by one displacement arm of the plurality of displacement arms. The plurality of displacement arms is configured to automatically displace the plurality of component pane capture elements between the plurality of positions to thereby enable capturing of component panes of the corresponding plurality of component pane sizes.

In accordance with a third aspect of the present disclosure, there is disclosed a method for handling component panes. The method includes identifying component pane size of component panes using a position control mechanism, the component pane size being one of a first component pane size and a second component pane size. The first component pane size is different from the second component pane size. The method also includes displacing at least one component pane capture element of a component pane handling apparatus to a first position corresponding to the first component pane size and a second position corresponding to the second component pane size. The component pane handling apparatus is configured to carry component panes of each of the first component pane size and the second component pane size.

BRIEF DESCRIPTION OF THE FIGURES

The following description of various embodiments of the present disclosure is made with reference to the figures, in which.

DETAILED DESCRIPTION

Figure 1:
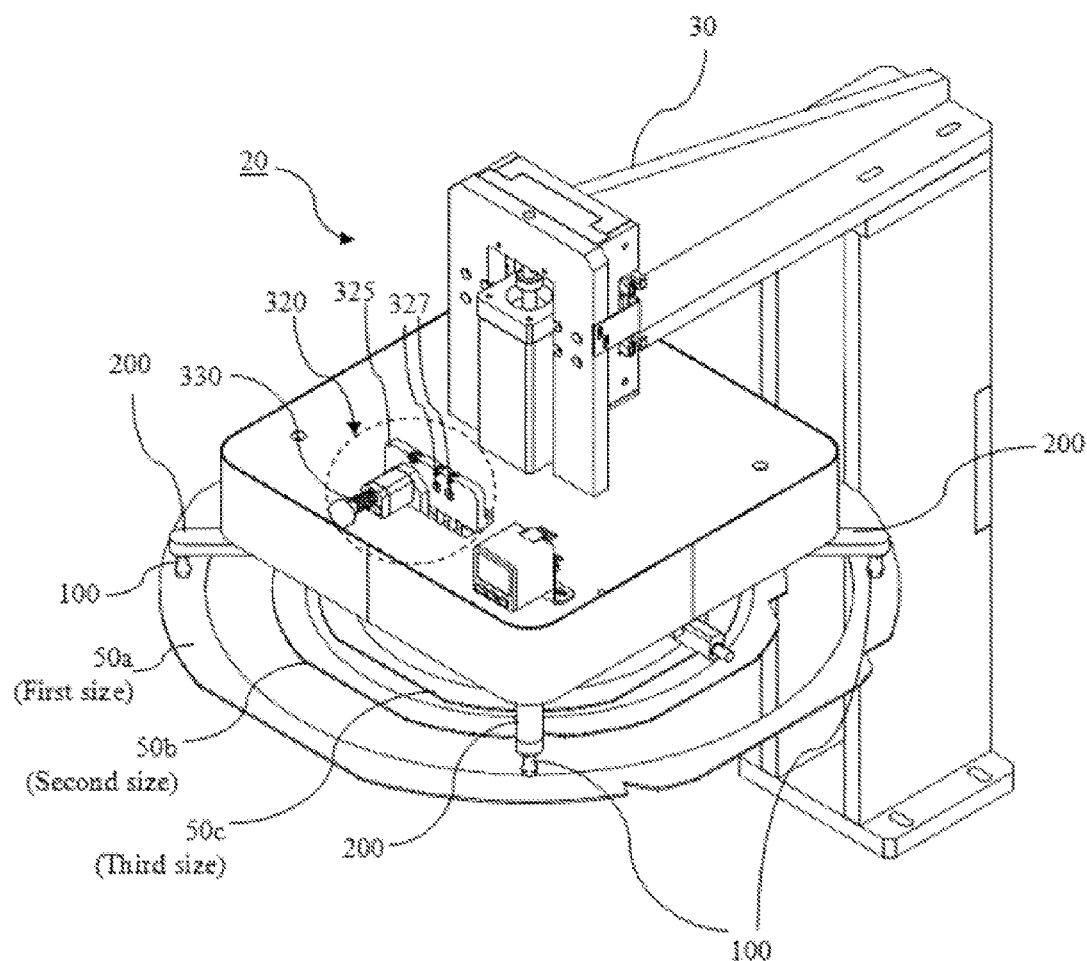
FIG. 1 is an illustrative diagram of a component pane handling apparatus according to an embodiment of the present disclosure.
Figure 2:
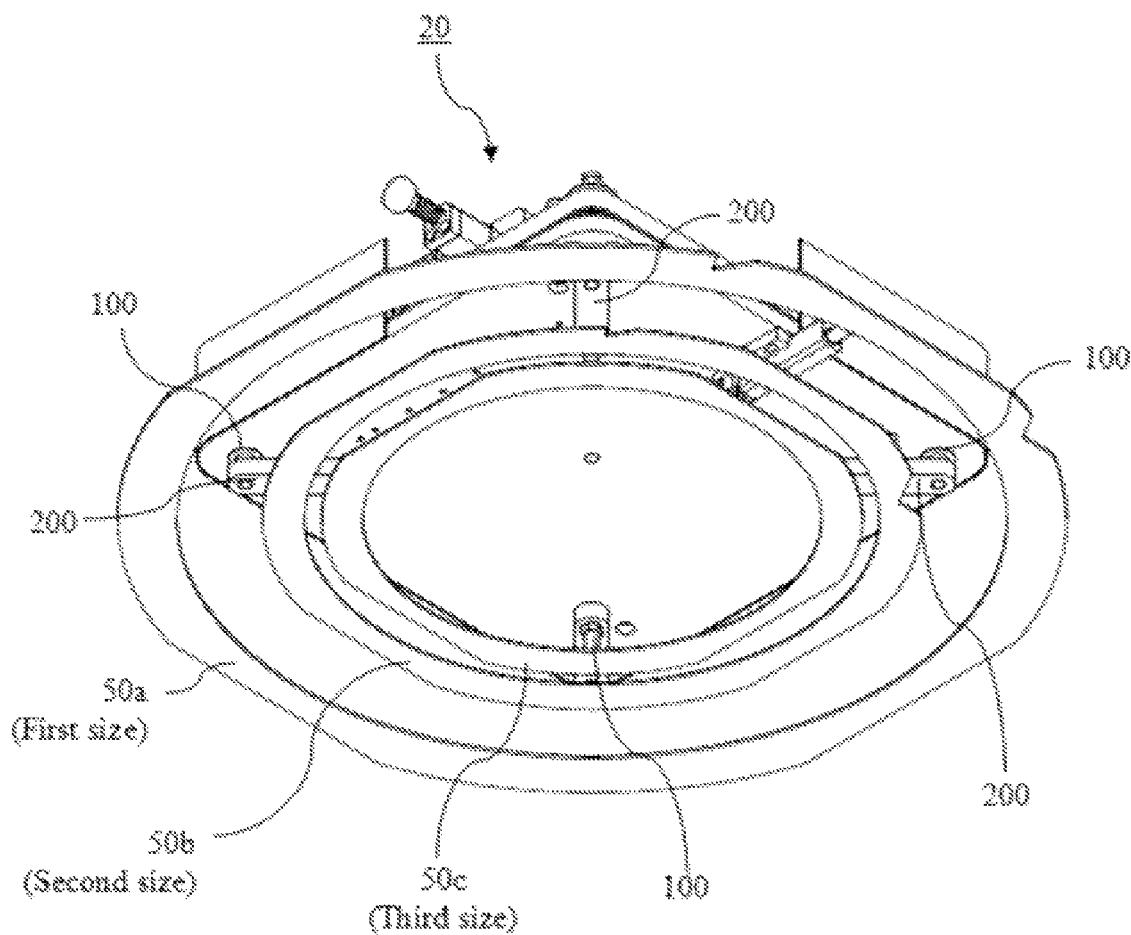
FIG. 2 shows a partial bottom view of component panes of different sizes carried by the component pane handling apparatus of FIG. 1.

Many embodiments of the present disclosure relate to an apparatus, more specifically a component pane handling apparatus or a component pane handler, which is configured to handle, carry, hold, capture, retrieve, and/or transfer components, component carriers, or component panes of at least two different sizes. In various embodiments in accordance with the present disclosure, the term "component pane" encompasses a device, apparatus, structure, or member such as a frame or chassis that can carry, support, hold, retain, or at least partially surround, enclose, or define a border relative to a peripheral portion of a component such as a semiconductor wafer or similar type of substrate. A component pane can provide or enable the provision of one or more surfaces (e.g., flat of substantially flat surfaces) that can carry (e.g., by way of a tensioned sheet of material such as an adhesive film) a portion of a component such as a semiconductor wafer. In representative embodiments, component panes can be film frames. In some embodiments, the term "component panes" can also encompass substrates themselves, such as wafers, solar panels, or electrical components such as printed circuit boards.

The component pane handling apparatus includes at least one component pane capture element (also referred to as a component pane carrier element, a component pane holding element, or a component pane retrieval element), and in many embodiments multiple component pane capture elements (e.g., two, three, four, or more component pane capture elements). Each component pane capture element is configured and/or constructed to capture, handle, carry, securely retain, or hold onto component panes, for example semiconductor-related component panes such as film frames or wafers.

In most embodiments, the at least one component pane capture element of the component pane handling apparatus is displaceable between a number of different positions (e.g., at least a first position and a second position), each position corresponding to a specific component pane size (e.g., a first component pane size and a second component pane size, respectively). The displacement and positioning of the at least one component pane capture element at a particular position (e.g., the first position or the second position) at least one of facilitates or effectuates handling, carrying, capturing, holding, retrieving, and/or transfer of component panes of a corresponding size (e.g., the first component pane size or the second component pane size, respectively). Therefore, the at least one component pane capture element of the component pane handling apparatus can be displaced to one of facilitate or enable the handling, carrying, capturing, holding, retrieving, and/or transferring of component panes of different sizes by the component pane handling apparatus.

The component pane handling apparatus can further include a position control mechanism or module coupled to the component pane capture element(s). The position control mechanism is configured to control the relative displacement and position of the component pane capture element(s). The position control mechanism can include a manual control mechanism (also referred to as a manual adjustment mechanism or structure) and/or an automatic control mechanism (also referred to as an automatic adjustment mechanism or module). In many embodiments, the manual control mechanism is configured to facilitate, effectuate, and/or control the displacement and position of the component pane capture element(s) in response to a received user (or manual) input or selection. The automatic control mechanism is configured to facilitate, effectuate, and/or control the displacement and position of the component pane capture element(s) in response to an automatically, at least partially automatically, or at least substantially automatically, sensed, captured, detected, or identified component pane characteristic or property (e.g., component pane size, surface area, planar component surface area, substantially planar component surface area, or spatial extent).

In most embodiments, the component pane handling apparatus includes at least one displacement mechanism, arm, module, or lever coupled to the component pane capture element(s). In many embodiments wherein the component pane handling apparatus includes multiple component pane capture elements, the component pane handling apparatus can also have a corresponding number of displacement arms, each displacement arm carrying one component pane capture element. It will be understood that each displacement arm can alternatively carry more than one component pane capture element. A displacement, translation, and/or rotation of at least a portion of the displacement arms can facilitate or effectuate displacement of the component pane capture elements carried thereby to different positions for handling, carrying, retrieving, or capturing component panes of corresponding sizes. Said displacement, translation, movement, and/or rotation of at least a portion of the displacement arms can be facilitated, effectuated, and/or controlled by the position control mechanism.

In several embodiments, the displacement, translation, and/or rotation of at least a portion of the displacement arms and the corresponding displacement and position of the component pane capture elements carried by said displacement arms can be performed in a controlled, coordinated, synchronized, and/or automatic manner.

Representative aspects of apparatuses, processes, methods, and/or techniques for handling component panes, for example semiconductor-related components such as film frames, of multiple different sizes are described in detail hereinafter with reference to FIG. 1 to FIG. 11, in which like or analogous elements or process portions are shown numbered with like or analogous reference numerals. Relative to descriptive material corresponding to one or more of FIGS. 1 to 11, the recitation of a given reference numeral can indicate simultaneous consideration of a FIG. in which such reference numeral was previously shown. The embodiments provided by the present disclosure are not precluded from applications in which particular fundamental structural and/or operational principles present among the various embodiments described herein are desired. In addition, the present disclosure relates to and incorporates in their entirety by reference Singapore patent applications entitled "System And Method For Handling And Aligning Component Panes Such As Film Frames And Wafers" (Singapore Patent Application No. 201103425-3) and "A System and Method Using Multiple Component Pane Handlers Configured to Handle and Transfer Component Panes" (Singapore Patent Application No. 201103418-8), each filed 12 May 2011 by Applicant "Semiconductor Technologies and Instruments Pte Ltd".

Aspects of Representative Component Pane Handling Apparatus

FIG. 1 to FIG. 10 show various aspects of a component pane handling apparatus 20 (also referred to as a component pane handlers, a component pane capture apparatus, a component handling apparatus, or a component capture apparatus) according to particular embodiments of the present disclosure.

Figure 10A:
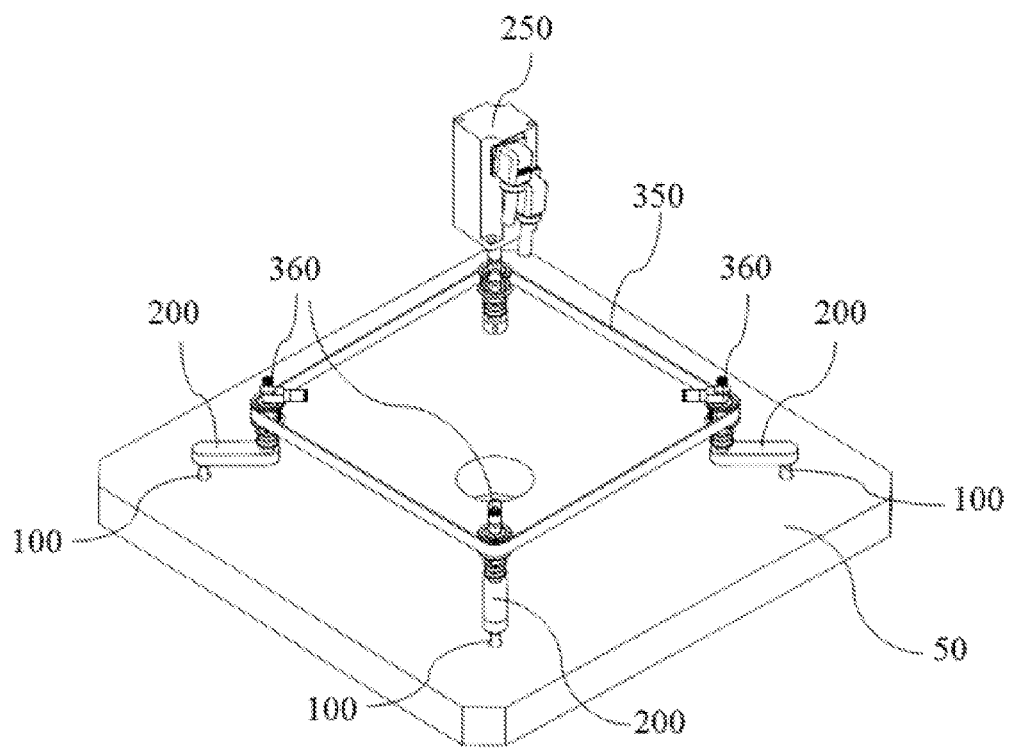
FIG. 10A shows a component pane handling apparatus including four displacement arms, four component pane capture elements, and an actuator, the component pane handling apparatus configured to handle, capture, retrieve, or hold a component pane of a square shape in accordance with an embodiment of the present disclosure.
Figure 10B:
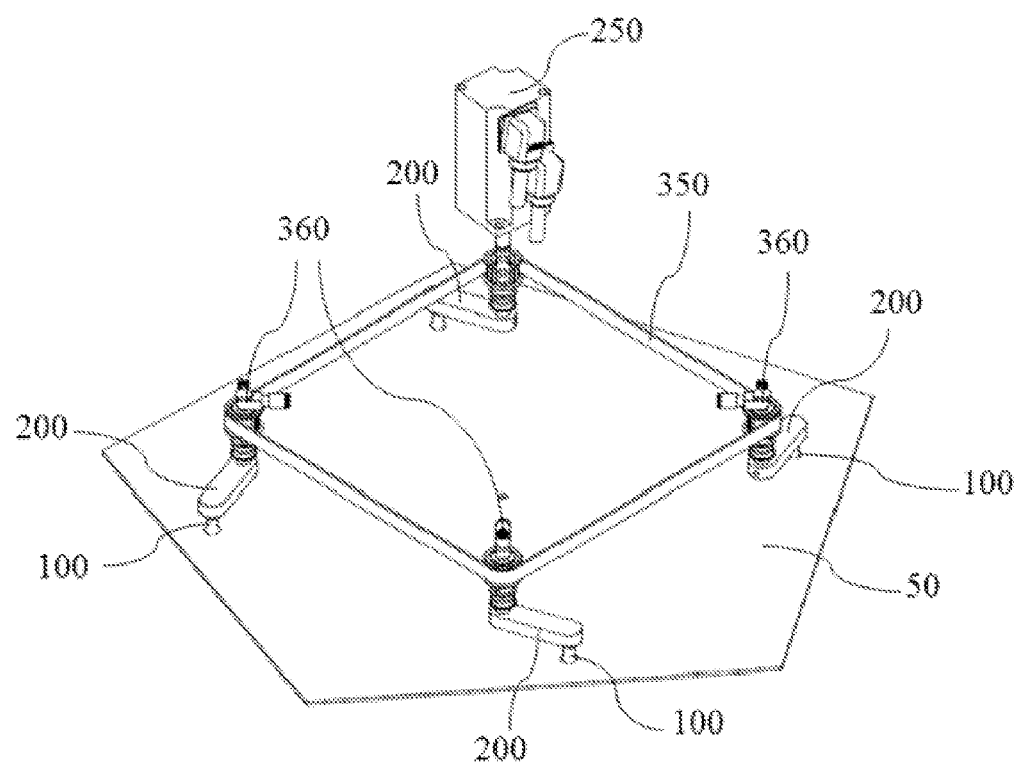
FIG. 10B shows a component pane handling apparatus including four displacement arms, four component pane capture elements, and an actuator, the component pane handling apparatus configured to handle, capture, retrieve, or hold a component pane of a pentagonal shape in accordance with an embodiment of the present disclosure.

The component pane handling apparatus 20 is configured for handling, capturing, holding, carrying, retrieving, and/or transferring component panes 50 of a number of different sizes. For purposes of clarity and brevity, the following description of the component pane handling apparatus 20 of various embodiments of the present disclosure is provided with reference to the use of the component pane handling apparatus 20 for handling film frames 50. It will be understood that reference to component panes 50 can include reference to other component panes or component frames including semiconductor-related components such as wafers, packaged semiconductor chips, electronic devices such as printed circuit boards, solar cell panels, solar wafer panels, and/or solar panels. Accordingly, the component pane handling apparatus 20 can be used for handling, capturing, holding, carrying, retrieving, and/or transferring component panes including semiconductor-related components such as wafers, packaged semiconductor chips, electronic devices such as printed circuit boards, solar cell panels, solar wafer panels, and/or solar panels. The component pane handling apparatus 20 of certain embodiments of the present disclosure is configured to handle other types of component panes such as ceramic tiles or machined parts that can have multiple predetermined or standard sizes. For example, FIG. 10A and FIG. 10B show the component pane handling apparatus 20 handling, capturing, retrieving, or carrying component panes of different sizes and shapes, for example rectangular- and pentagonal-shaped component panes.

In multiple embodiments of the present disclosure, for instance as clearly shown in FIG. 1 to FIG. 9, the component pane handling apparatus 20 is configured for handling, capturing, holding, carrying, retrieving, and/or transferring component panes 50, more specifically film frames 50*a*, 50*b*, 50*c*, of three different sizes. For example, the component pane handling apparatus 20 can be configured to handle, capture, hold, carry, retrieve, and/or transfer twelve-inch film frames 50*a*, eight-inch film frames 50*b*, and six-inch film frames 50*c*. It will be understood that the component pane handling apparatus 20 can alternatively be configured for handling, capturing, holding, carrying, retrieving, and/or transferring film frames 50 of other sizes.

The component pane handling apparatus 20 can be coupled to, or can include, a displacement effector 30. The displacement effector 30 is configured to displace, translate, and/or rotate the component pane handling apparatus 20 between a number of different positions, stations, or other system devices or units. The displacement, translation, and/or rotation of the component pane handling apparatus 20 enables the displacement and transfer of the component panes 50 (e.g., film frames 50) captured or carried by the component pane handling apparatus 20 between a number of different locations, positions, stations, or broader system components. For instance, the component pane handling apparatus 20 can be used for transferring component panes 50 (e.g., film frames 50) from a component pane loading station (also referred to as a component pane storage station, a component frame loading station, or a component frame storage station), for example a film frame loading station or film frame storage station, to a vacuum table or vacuum chuck.

In many embodiments of the present disclosure, the displacement, translation, and/or rotation of the component pane handling apparatus 20 can be determined and/or controlled by a set of instructions (e.g., computer program instructions) executed by a computing device or instruction processing unit (e.g., a microprocessor or a microcontroller) (not shown) that is coupled to the component pane handling apparatus 20 and the displacement effector 30. More specifically, at least one of initiation, termination, direction, and speed of displacement, translation, and/or rotation of the component pane handling apparatus 20 can be determined and/or controlled by a set of instructions (e.g., computer program instructions) executed and/or controlled by a computing device or processor that is coupled to the component pane handling apparatus 20 and the displacement effector 30.

The component pane handling apparatus 20 includes at least one component pane capture element 100, and in many embodiments a plurality of component pane capture elements 100 (also referred to as component pane carrier elements or component pane holding elements or retrieval elements) and at least one displacement arm 200, and in many embodiments a plurality of displacement arms 200 (also referred to as displacement mechanisms, structures, linkages, or levers; or translation arms, mechanisms, structures, or levers).

In many embodiments, each displacement arm 200 carries, or couples to, one component pane capture element 100. As shown in FIG. 1 to FIG. 9, the component pane handling apparatus 20 can include multiple (e.g., three or four) displacement arms 200, each displacement arm 200 carrying one component pane capture element 100. Alternatively, the component pane handling apparatus 20 can include multiple displacement arms 200, wherein each displacement arm 200 carries or couples to two or more component pane capture elements 100.

The component pane capture elements 100 of the component pane handling apparatus 20 can be displaced and positioned at multiple variable, adjustable, predetermined, or designated relative positions. Each relative position of component pane capture elements 100 can correspond to a particular component pane size (e.g., a particular film frame size).

The position of a plurality of component pane capture elements 100 at a particular relative position one of facilitates or effectuates handling, capturing, carrying, retrieving, and/or holding of component panes 50 (e.g., film frames 50) of a corresponding component pane size (e.g., film frame size). The displacement, and hence variation of the relative position, of the plurality of component pane capture elements 100 enables the component pane handling apparatus 20 to handle, capture, carry, retrieve, or hold component panes 50 (e.g., film frames 50) of different sizes. Further description of structural, functional, and operational aspects of the component pane capture elements 100 is provided below.

The component handling apparatus 20 can further include a position control mechanism 300. The position control mechanism 300 is configured for controlling the displacement, translation, and/or positioning of the at least one component pane capture element 100, and in many embodiments the plurality of component pane capture elements 100, of the component handling apparatus 20 between different predetermined, specified, or designated positions for facilitating or effectuating handling, capturing, carrying, holding, and/or transferring of component panes 50 (e.g., film frames 50) of corresponding component sizes.

In many embodiments, the position control mechanism 300 includes at least one of a manual control mechanism 320 (or manual adjustment mechanism 320) and an automatic control mechanism (or automatic adjustment mechanism) for facilitating, effectuating, and/or controlling displacement and positioning of the component pane capture element(s) 100. Further description of structural, functional, and operational aspects of the position control mechanism 300 is provided below.

Various Aspects of the Component Pane Capture Elements/ Film Frame Capture Elements As described above, in many embodiments, the component pane handling apparatus 20 includes a plurality of component pane capture elements 100. The number of component pane capture elements 100 can be varied as desired, for instance depending upon the size, weight, and/or shape of the component panes 50 (e.g., film frames 50) handled by the component pane handling apparatus 20. The number of component pane capture elements 100 can also be varied depending upon type of component pane 50 handled, carried, retrieved, or captured by the component pane handling apparatus 20.

In several embodiments, for instance in the embodiments shown in FIG. 1 to FIG. 7B and FIG. 9 to FIG. 10B, the component pane handling apparatus 20 includes four component pane capture elements 100. Each of the four component pane capture element 100 can be positioned or disposed and/or positioned relative to a corner of the component pane handling apparatus 20, which can be of a substantially square or rectangular shape. It will be understood that where the component pane handling apparatus 20 can include alternative numbers of component pane capture elements 100, for example one, two, three, four, five, or more component pane capture elements 100. It will also be understood that component pane capture element 100 can be positioned or disposed and/or positioned relative to a center of the component pane handling apparatus 20, which can be of a circular shape, a substantially square or rectangular shape. For example, as shown FIG. 8, the component pane handling apparatus 20 can include three component pane capture elements 100 arranged in a triangular configuration.

The number and configuration of component pane capture elements 100 of a particular component pane handling apparatus 20, as well as the overall shape, size, and design of the component pane handling apparatus 20, can be varied as desired, for instance depending on manufacturing costs or other limitations, ergonomic considerations, structural redundancy, and/or type of component panes to be handled by said component pane handling apparatus 20.

In many embodiments of the present disclosure, the plurality of component pane capture elements 100 include, or is, a plurality of suction or vacuum elements 100. The plurality of suction elements 100 are configured to apply a suction force to the component pane 50, more specifically a film frame 50, for holding, capturing, retrieving, or securing the film frame 50 to the component pane handling apparatus 20. The quantity, amount, and/or duration of the suction force applied to the film frame 50 by the plurality of suction elements 100 can be controlled and/or varied as required. In particular embodiments, the quantity, amount, and/or duration of the suction force applied to the film frame 50 by the plurality of suction elements 100 can be controlled and varied depending upon a set of instructions executed by a computing device or processor that is coupled to the plurality of suction elements 100.

The plurality of suction elements 100 can be configured for picking up film frames 50 from a particular station, device, or location (e.g., a film frame loading station, a film frame storage unit or cassette, or a robotic component handler and transferring said film frames 50 to another station, device, or location (e.g., a vacuum table, a component processing or inspection station, or another robotic component pane handler).

The application of suction force by the plurality of suction elements 100 can effectuate pick up, capture, coupling, carrying, retrieving, and/or securing of the film frame 50 by or to the component pane handling apparatus 20. Subsequently, a reduction, cessation, disapplication, or stopping of application of suction force by the plurality of suction elements 100 to the film frame 50 can effectuate release of the film frame 50 from the plurality of suction elements 100, and hence from the component pane handling apparatus 20.

The plurality of component pane capture elements 100 is configured to capture, pick up, retrieve, or carry component panes 50 (e.g., film frames 50). While the use of suction elements 100 is described above, it will be understood that the use of other means, tools, or mechanisms, for instance adhesive means, gripper mechanisms, and/or magnetic force devices, can alternatively and/or additionally be employed by the plurality of component pane capture elements 100 for facilitating or effectuating the capture, pick up, retrieval, or carry of component panes 50 (e.g., film frames 50).

Various Aspects of the Displacement Mechanism or Translation Mechanism

As described above, the plurality of component pane capture elements 100 (e.g., suction elements 100) can be displaced between a number of different positions, each position corresponding to a different component pane size (e.g., film frame size or shape).

In many embodiments, each component pane capture element 100 is carried by or coupled to a displacement arm 200. The displacement of the component pane capture element 100 can be facilitated, effectuated, and/or dependent upon displacement, operation, and/or configuration of the displacement arm 200.

Figure 4:
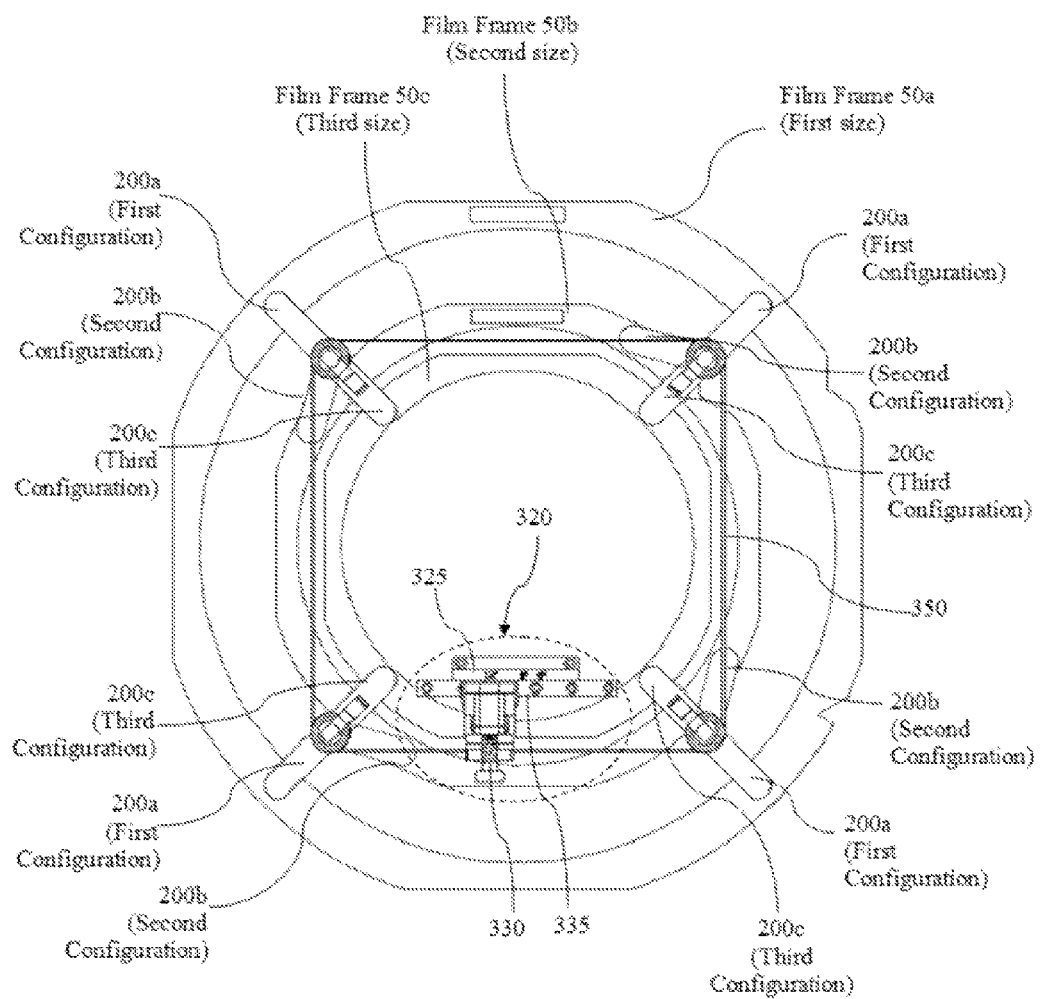
FIG. 4 shows three different possible configurations or positions of a set of displacement arms for positioning a set of component pane capture elements between three different possible positions for carrying component panes of three different sizes in accordance with an embodiment of the present disclosure.

FIG. 4 shows three different relative configurations or positions of the plurality of displacement arms 200. More specifically, FIG. 4 shows a first configuration of the plurality of displacement arms 200a, a second configuration of the plurality of displacement arms 200b, and a third configuration of the plurality of displacement arms 200c. Each of the first configuration, second configuration, and third configuration of the plurality of displacement arms 200a, 200b, and 200c effectuates positioning of the plurality of component pane capture elements 100 at a corresponding relative position, for example, a first position, second position, and third position respectively.

In several embodiments, the position of the plurality of displacement arms 200a in accordance with the first configuration positions the plurality of component pane capture elements 100 at the first position for facilitating or enabling capture of film frames 50a of a first size (e.g., twelve inches). The position of the plurality of displacement arms 200b in accordance with the second configuration positions the plurality of component pane capture elements 100 at the second position for facilitating or enabling capture of film frames 50b of a second size (e.g., eight inches). In addition, the position of the plurality of displacement arms 200c in accordance with the third configuration positions the plurality of component pane capture elements 100 at the third position for facilitating or enabling capture of film frames 50c of a third size (e.g., six inches).

Figure 5A:
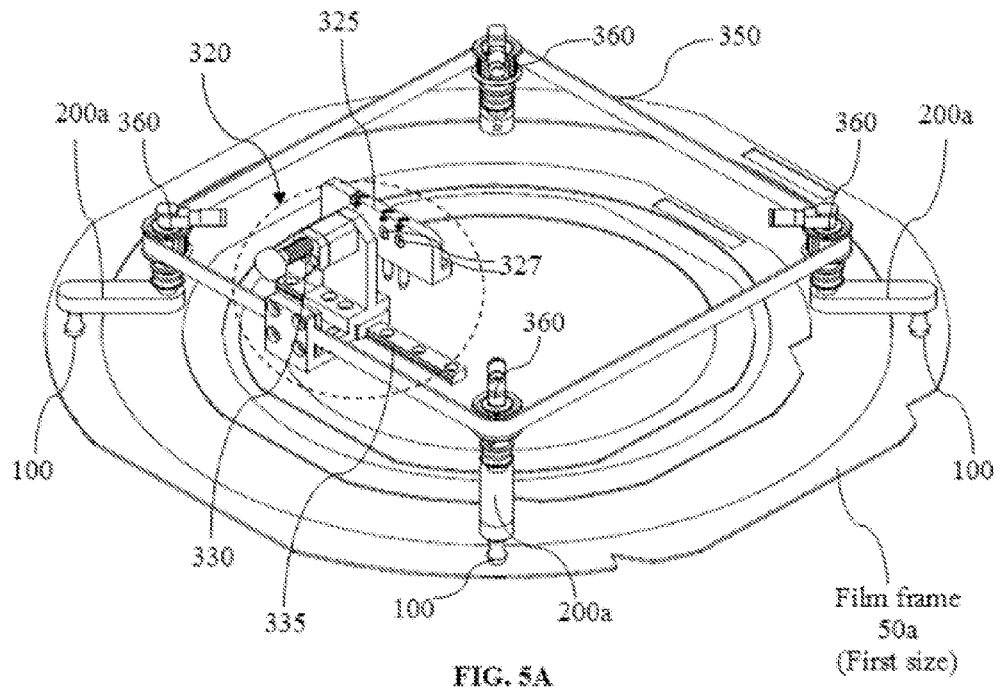
FIG. 5A is a partial isometric view of a manual control mechanism configured or manipulated in a manner that positions a set of component pane capture elements at a first position for carrying a component pane of a first component pane size in accordance with an embodiment of the present disclosure.
Figure 5B:
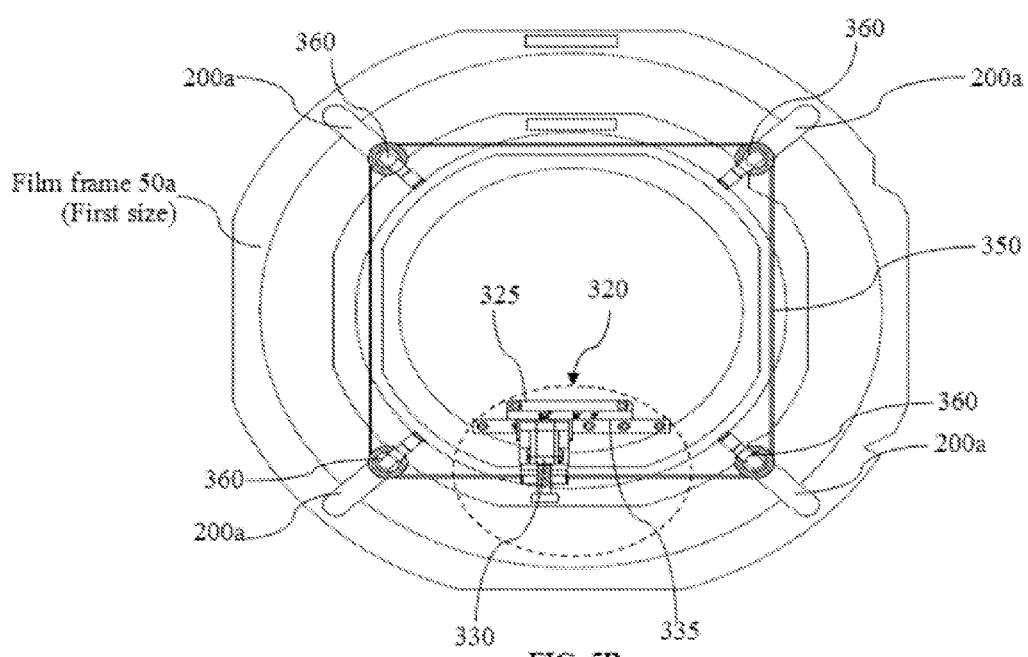
FIG. 5B is a top view of the manual control mechanism configured or manipulated in a manner that positions the set of component pane capture elements at the first position in a manner as shown in FIG. 5A.

As shown in FIG. 5A and FIG. 5B, when the plurality of displacement arms 200a assumes, or is positioned in association with, the first configuration, the plurality of component pane capture elements 100 (e.g., the plurality of suction elements 100) is positioned or disposed at the first position for handling, capturing, carrying, holding, retrieving, or transferring film frames 50a of the first size (e.g., twelve inches).

Figure 6A:
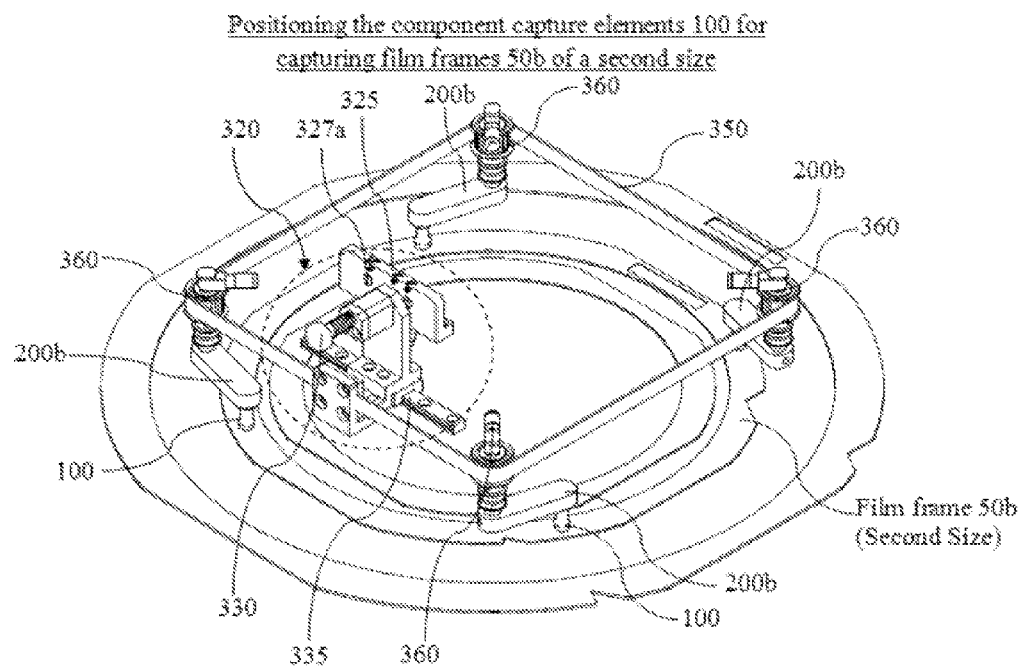
FIG. 6A is a partial isometric view of a manual control mechanism configured or manipulated in a manner that positions a set of component pane capture elements at a second position for carrying a component pane of a second component pane size in accordance with an embodiment of the present disclosure.
Figure 6B:
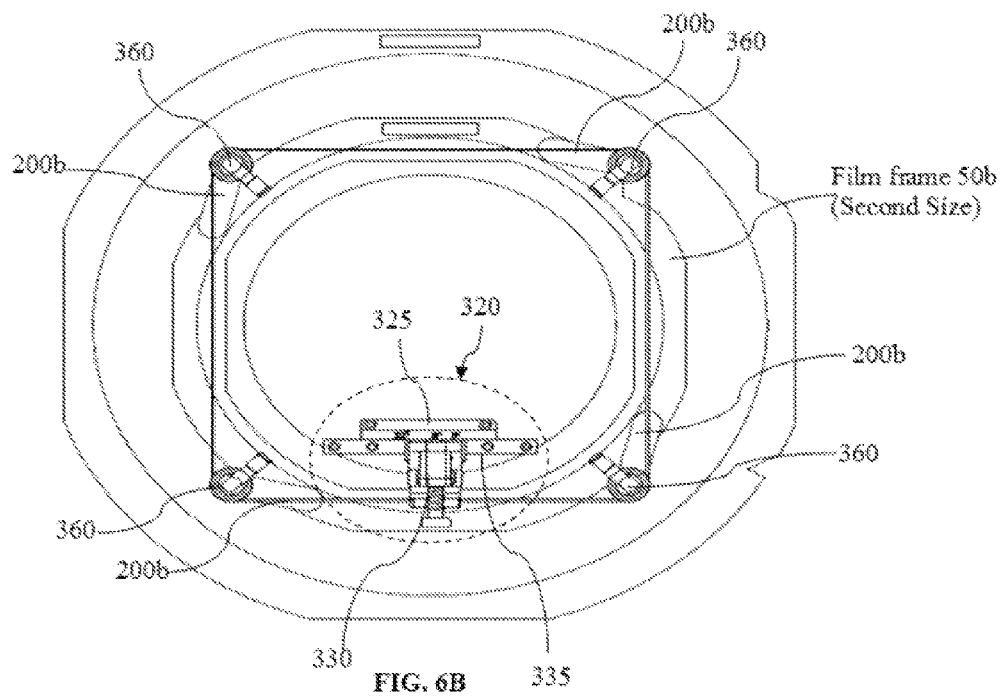
FIG. 6B is a top view of the manual control mechanism configured or manipulated in a manner that positions the set of component pane capture elements at the second position in a manner as shown in FIG. 6A.

As shown in FIG. 6A and FIG. 6B, when the plurality of displacement arms 200b assumes, or is positioned in association with, the second configuration, the plurality of component pane capture elements 100 (e.g., the plurality of suction elements 100) is positioned or disposed at the second position for handling, capturing, carrying, holding, retrieving, or transferring film frames 50b of the second size (e.g., eight inches).

Figure 7A:
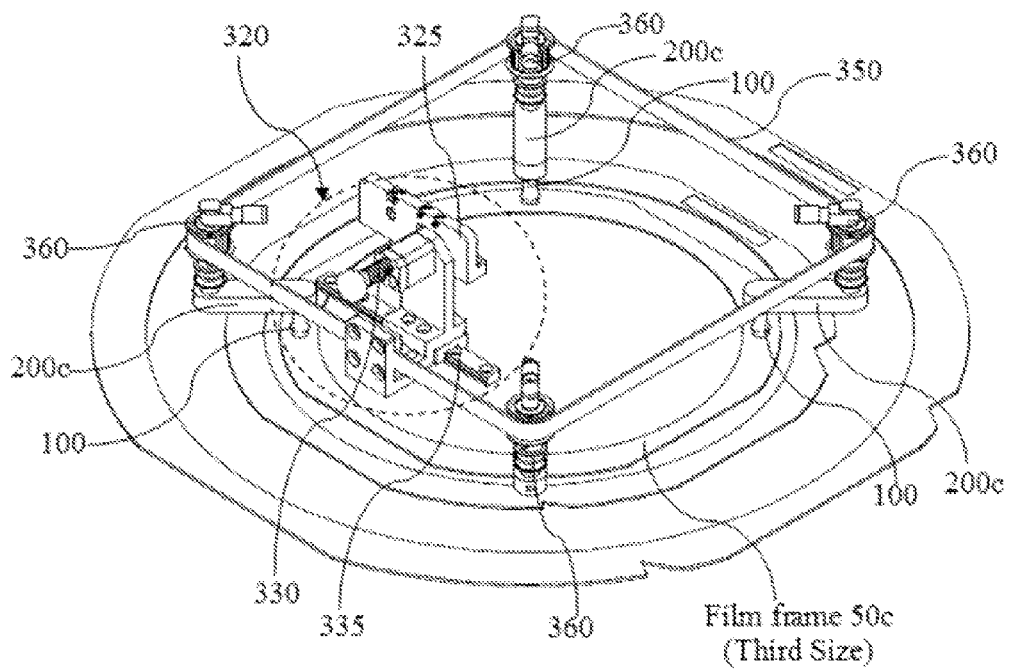
FIG. 7A is a partial isometric view of a manual control mechanism configured or manipulated in a manner that positions a set of component pane capture elements at a third position for carrying a component pane of a third component pane size in accordance with an embodiment of the present disclosure.
Figure 7B:
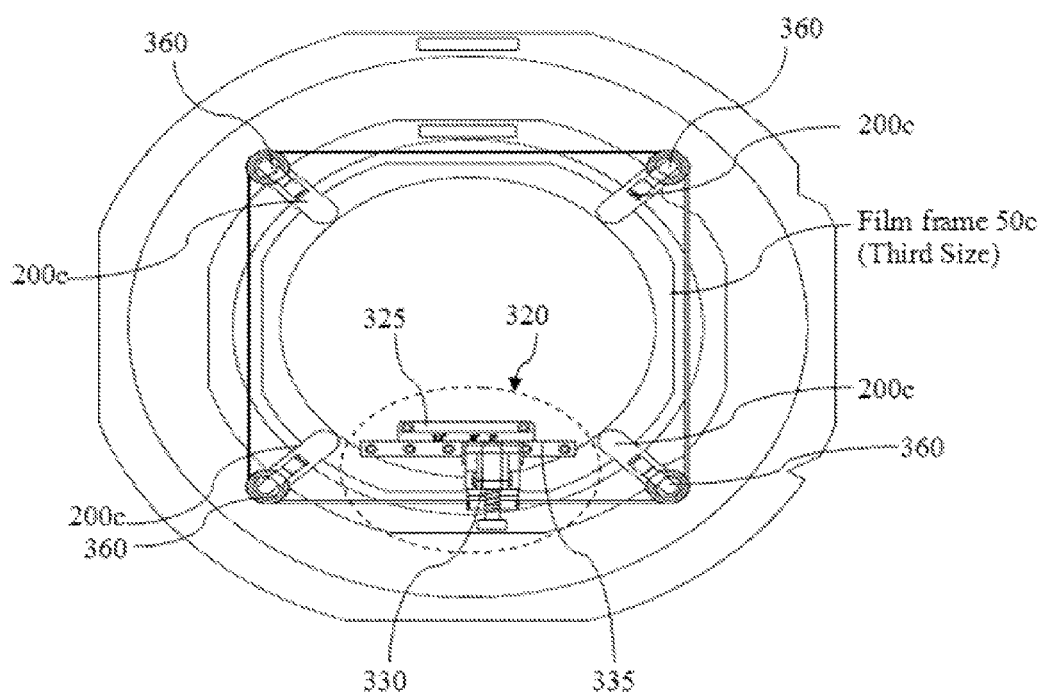
FIG. 7B is a top view of the manual control mechanism configured or manipulated in a manner that positions the set of component pane capture elements at the third position in a manner as shown in FIG. 7A.

As shown in FIG. 7A and FIG. 7B, when the plurality of displacement arms 200c assumes, or is positioned in association with, the third configuration, the plurality of component pane capture elements 100 (e.g., the plurality of suction elements 100) is positioned or disposed at the third position for handling, capturing, carrying, holding, retrieving, or transferring film frames 50c of the third size (e.g., six inches).

In several embodiments of the present disclosure, each displacement arm 200 can be of an elongated shape or configuration. The component pane capture element 100 carried by or coupled to each displacement arm 200 can be displaced along the displacement arm 200 for position at the different positions. This is to say, the displacement of the component pane capture element 100 along the displacement arm 200 effectuates positional variation of said component pane capture element 100. In particular embodiments, the component pane capture element 100 can be further extended a distance away from the displacement arm 200, for instance via a linking structure or linking mechanism (not shown). The extension of the component pane capture elements 100 a distance away from the displacement arms 200 can allow positioning of the plurality component pane capture elements 100 at an increased distance apart from each other.

It will be understood that the plurality displacement arms 200 can adopt or assume other configurations, shapes, and/or displacement characteristics known to a person of ordinary skill in the art to thereby enable or effectuate different displacement and/or positioning characteristics associated with the plurality of component pane capture elements 100 carried by the plurality of displacement arms 200. The displacement, translation, movement, and/or rotation of the displacement arms 200, and corresponding displacement of the component pane capture elements 100 carried thereby, can be controlled by the position control mechanism 300 of the component pane handling apparatus 20.

Various Aspects of the Position Control Mechanism

The position control mechanism 300 is coupled to each displacement mechanism 200 of the plurality of displacement arms 200 and to each component pane capture element 100 of the plurality of component pane capture elements 100. In most embodiments, the position control mechanism 300 controls, effectuates, and/or determines displacement and position of the plurality of component pane capture elements 100. The position control mechanism 300 can control and/or effectuate displacement, rotation, and/or translation of the displacement arms 200.

In multiple embodiments, the position control mechanism 300 is coupled to each displacement arm 200 of the plurality of displacement arms 200 and to each component pane capture element 100 of the plurality of component pane capture elements 100 by way of a coupling or band structure 350 such as a harness, chain, cord, tape, or belt.

The coupling structure 350 can be coupled to each displacement arm 200 via a coupling support or module 360 that is carried by each displacement arm 200. In embodiments wherein the component pane handling apparatus 20 includes four displacement arms 200, the component pane handling apparatus 20 can also include four coupling modules 360, each coupling module 360 coupled to or carried by one displacement arm 200.

The connection or coupling of each displacement arm 200 of the plurality of displacement arms 200 via the corresponding coupling modules 360 and the coupling structure 350 can facilitate, enable, or effectuate a coordinated, substantially coordinated, synchronized, or substantially synchronized displacement of each displacement arm 200, and accordingly each component pane capture element 100 of the plurality of component pane capture elements 100. The connection or coupling between each displacement arm 200 via the corresponding coupling modules 360 and the coupling structure 350 one of facilitates or effectuates a coordinated or synchronized displacement and positioning of each component pane capture element 100 of the plurality of component pane capture elements 100 between different positions (e.g., between the first position, the second position, and the third positions).

In several embodiments, the intercoupling of the plurality of displacement arms 200 by the coupling structure 350 allows the position control mechanism 300 to control and/or effectuate displacement of the plurality of displacement arms 200 in a controlled, coordinated, and/or synchronized manner. A single control trigger or signal provided by the position control mechanism 300 can be sufficient for effectuating coordinated displacement of the plurality of displacement arms 200, and hence coordinated displacement of the plurality of component pane capture elements 100.

In many embodiments, the position control mechanism 300 includes at least one of the manual control mechanism 320 (or manual adjustment mechanism 320) and the automatic control mechanism (or automatic adjustment mechanism). In multiple embodiments, each of the manual control mechanism 320 and the automatic control mechanism is capable of identifying, indicating, sensing, detecting, determining, and/or responding to component pane size; and effectuating displacement and positioning of the plurality of component pane capture elements 100 based upon identified, positively indicated, sensed, detected, and/or determined component pane size.

Figure 3A:
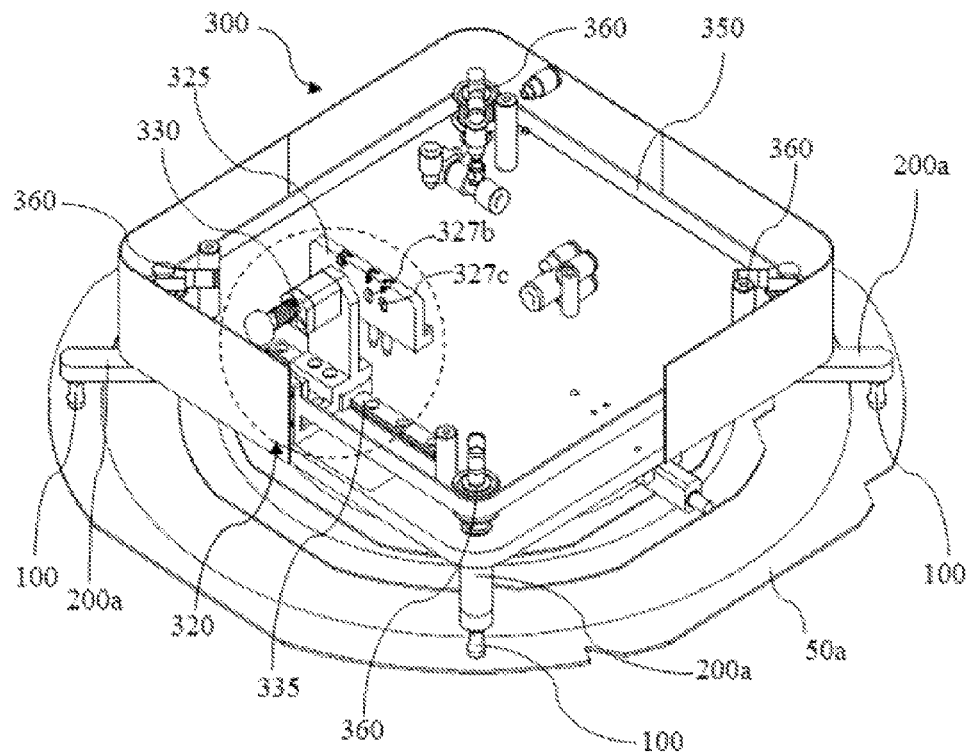
FIG. 3A shows a partial isometric view of a component pane handling apparatus carrying a component pane of a first size according to an embodiment of the present disclosure.
Figure 3B:
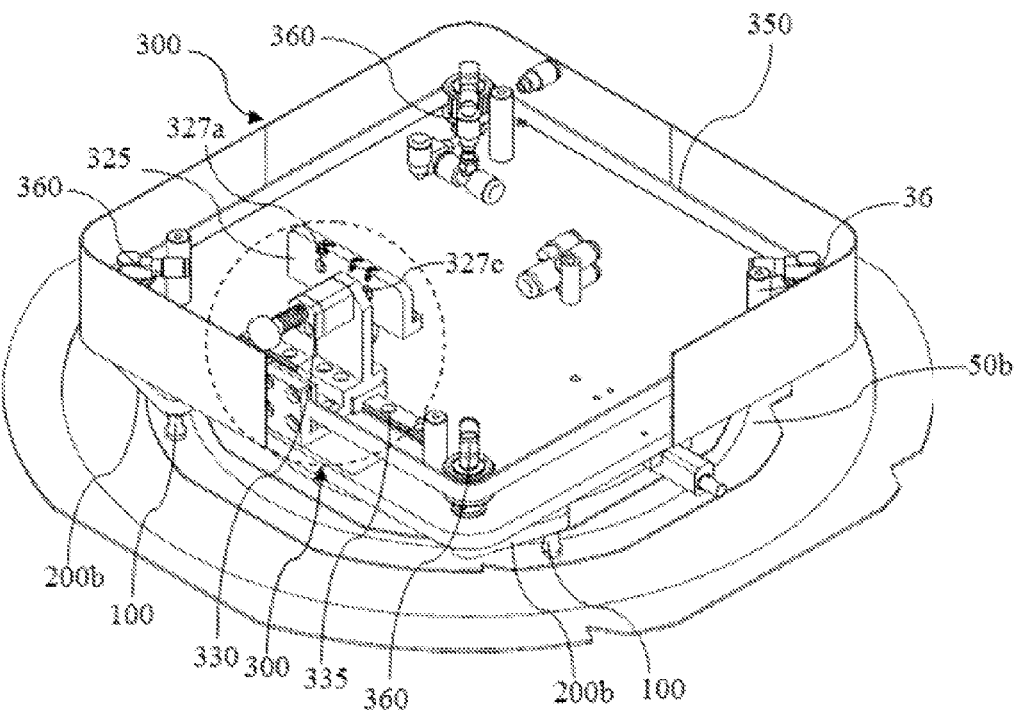
FIG. 3B shows a partial isometric view of a component pane handling apparatus carrying a component pane of a second size according to an embodiment of the present disclosure.
Figure 3C:
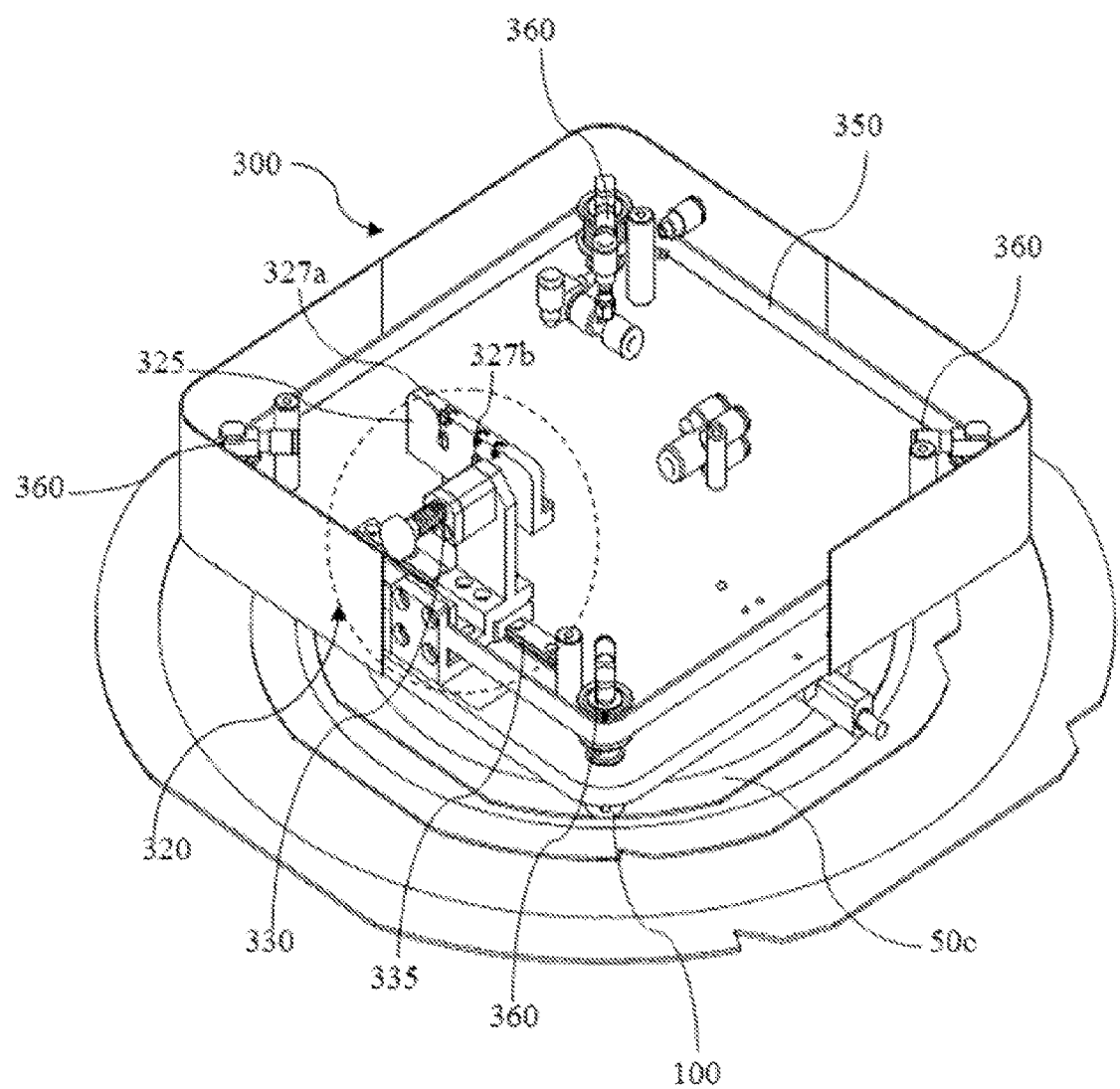
FIG. 3C shows a partial isometric view of a component pane handling apparatus carrying a component pane of a third size according to an embodiment of the present disclosure.

The following description of the manual control mechanism 320 is provided with primary reference to FIG. 3A to FIG. 3C. FIG. 3A to FIG. 3C show the use of the manual control mechanism 320 for controlling and effectuating displacement of the plurality of component pane capture elements 100 between three different positions (e.g., the first position, the second position, and the third position) for capturing, carrying, retrieving, or holding film frames 50 of three corresponding sizes (e.g., film frames 50a of the first size, film frames 50b of the second size, and film frames 50c of the third size).

In multiple embodiments, the manual control mechanism 320 or manual adjustment mechanism 320 includes a position selection interface 325, a moveable selector module, lever, or element 330 (hereinafter referred to as movable selector 330), and a selector movement guide 335.

The position selection interface 325 includes a number of engagement markers, indents, holes, grooves, or notches 327 (hereinafter referred to as engagement markers 327). The engagement markers 327 are formed within the position selection interface 325 and are shaped and configured to receive a portion of the moveable selector 330.

In several embodiments, each engagement marker 327 corresponds to one component pane size (e.g., film frame size), and hence to one relative position of the plurality of component pane capture elements 100. As shown in FIG. 3A to FIG. 3C, in some embodiments, the position selection interface 325 includes three engagement markers 327 (e.g., a first engagement marker 327a, a second engagement marker 327b, and a third engagement marker 327c). Each of the three engagement markers 327 correspond to a particular film frame size (e.g., the first size, the second size, and the third size respectively).

The engagement of the moveable selector 330 with a particular engagement marker 327 effectuates displacement and position of the plurality of component pane capture elements 100 at a particular position for enabling capture of film frames 50 of a corresponding size. As shown in FIG. 3A, the engagement of the movable selector 330 with the first engagement marker 327a positions the plurality of component pane capture elements 100 for capturing film frames 50a of the first size (e.g., twelve inches). As shown in FIG. 3B, the engagement of the movable selector 330 with the second engagement marker 327b positions the plurality of component pane capture elements 100 for capturing film frames 50b of the second size (e.g., eight inches). In addition, as shown in FIG. 3C, the engagement of the movable selector 330 with the third engagement marker 327c positions the plurality of component pane capture elements 100 for capturing film frames 50c of the third size (e.g., six inches).

The moveable selector 330 can be displaced or moved relative to the position selection interface 325 for correspondingly displacing and positioning the moveable selector 330 between each of the different engagement markers 327. The displacement or movement of the moveable selector 330 can be controlled, facilitated, or guided by the selector movement guide 335.

In many embodiments, the moveable selector 330 is accessible to a user, who is able to manually displace the moveable selector 330, and hence adjust the position of the moveable selector 330 between each of the different engagement markers 327. The user is able to manually displace the moveable selector 330 relative to the position selection interface 325 for variably positioning the moveable selector 330 for engagement with an intended or target engagement marker 327. Therefore, the user identifies, selects, or determines the size of the component panes 50 (e.g., film frames 50) that the component pane handling apparatus 20 is to capture, handle, carry, hold, and/or transfer.

The manual control mechanism 320 enables user effectuated input to be translated for control and/or effectuation of displacement of the component pane capture elements 100 to particular positions based upon component pane size and/or shape. In multiple embodiments, the manual control mechanism 320 is intercoupled to each displacement arm 200 and each component pane capture element 100 via the coupling structure 350 and the coupling modules 360. A user-effectuated input via the manual control mechanism 320 is translated via the coupling structure 350 and the coupling modules 360 to each displacement arm 200 for effectuating coordinated displacement of each displacement arm 200 of the set of displacement arms 200, and hence effectuating coordinated displacement of the component pane capture elements 100.

In several embodiments, the component pane handling apparatus 20, more specifically the position control mechanism 300 of the component pane handling apparatus 20, includes the automatic control mechanism. The displacement, translation, and/or rotation of the displacement arms 200, and hence the component pane capture elements 100 (e.g., suction elements 100) carried by the displacement arms 200, can be facilitated, effectuated, and/or controlled in response to a trigger, signal, or instruction(s) provided by the automatic control mechanism.

This is to say, the displacement, translation, and/or rotation of the plurality of displacement arms 200, and hence the displacement and position of the plurality component pane capture elements 100 to particular position(s) (e.g., the first position, second position, or third positions) for facilitating or enabling capture of component panes 50 (e.g., film frames 50) of corresponding sizes (e.g., the first size, second size, or third size respectively) can be determined or controlled by the automatic control mechanism.

The automatic control mechanism can be configured for automatically or at least substantially automatically detecting, identifying, sensing, or determining component pane size or shape (e.g., film frame size or shape). In several embodiments, the automatic control mechanism is coupled to the plurality of displacement arms 200 and the plurality of component pane capture elements 100. The automatic control mechanism can effectuate, facilitate, and/or control the displacement, translation, and/or rotation of the plurality of displacement arms 200, and correspondingly the displacement and position of the plurality of component pane capture elements 100 based upon the sensed, detected, identified, or determined component pane size (e.g., film frame size or wafer size).

In several embodiments, the automatic control mechanism is coupled to the plurality of displacement arms 200 and the plurality of component pane capture elements 100 by way of the coupling structure 350. The coupling structure 350 can facilitate or enable coordinated, synchronized, or simultaneous displacement, translation, and/or rotation of each displacement arm 200 of the plurality of displacement arms 200, and hence coordinated, synchronized, or simultaneous displacement and position of each component pane capture element 100 of the plurality of component pane capture elements 100.

Alternatively, the automatic control mechanism is able to effectuate selective displacement of at least one displacement arm 200 of the plurality of displacement arms 200, and accordingly selective displacement of at least one component pane capture element 100 of the plurality of component pane capture elements 100. By selectively displacing and positioning at least one displacement arm 200, and at least one component pane capture element 100, the automatic control mechanism is able to vary or adjust the relative position of the plurality of displacement arms 200, and hence plurality of component pane capture elements 100, for allowing or enabling the component pane handling apparatus 20 to capture or pick up film frames 50 of different sizes.

In several embodiments, the automatic control mechanism is coupled to an automatic sensing device or mechanism (e.g., an automatic sensor) (not shown). The automatic sensing device is configured to sense or determine size and/or shape of the component panes 50 (e.g., film frames 50); and thereafter generate, provide, and/or transmit a control signal or actuation command for displacing and positioning at least one displacement arm 200, and hence at least one component pane capture element 100, for enabling capture or pick up of component panes 50 (e.g., film frames 50 or wafers) of the sensed size and/or shape.

The automatic sensing device can include at least one, and in many embodiments a plurality of, proximity or position sensors, configured to detect, sense, or determine size and/or shape of component panes 50 (e.g., film frames 50). Based upon the component pane size and/or shape detected or sensed by the proximity or position sensor(s), the automatic sensing device, and hence the automatic control mechanism, is able to control and/or effectuate displacement and position of the plurality of component pane capture elements 100 at an intended, target, or desired relative position for capturing component panes 50 (e.g., film frames 50) of a corresponding size.

The automatic sensing device can be positioned or located at, within, or proximal to a component pane loading station (e.g., film frame loading station or film frame storage stations) (not shown). The automatic sensing device positioned at the component pane loading station (e.g., film frame loading station) can be configured to automatically sense or detect size of film frames 50 placed or stored at the film frame loading station. Based upon the size of film frames 50 placed at the film frame loading station as sensed by the automatic sensing device, the automatic control mechanism can then effectuate and/or control the displacement of the plurality of component pane capture elements 100. More specifically, based upon the size of film frames 50 placed at the film frame loading station as sensed by the automatic sensing device, the automatic control mechanism can effectuate displacement and position of the plurality of component pane capture elements 100 to an appropriate relative position for enabling the capture or pick up of the film frames 50 from the film frame loading station. In other embodiments, the automatic sensing device is carried by or coupled to the component pane handling apparatus 20 for sensing, detecting, or determining component pane size (e.g., film frame size) prior to capture, pick up, or handling of the component panes 50 (e.g., film frames 50) by the component pane handling apparatus 20.

Various Aspects of an Actuator or Servomotor

In many embodiments of the present disclosure, the component pane handling apparatus 20 includes, or is coupled to at least one actuator 250 (e.g., electromechanical actuator) or servomotor 250.

Figure 8:
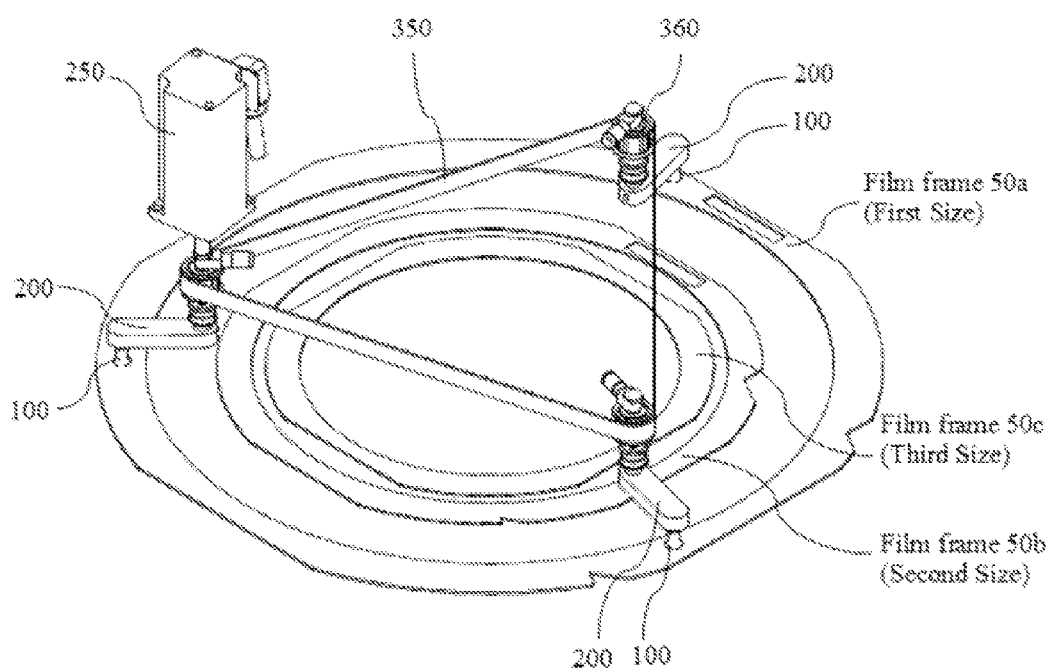
FIG. 8 shows a component pane handling apparatus that includes three displacement arms and three component pane capture elements, the component pane handling also including an actuator or motor coupled to the three displacement arms and configured to effectuate displacement of the three displacement arms and three component pane capture elements according to an embodiment of the present disclosure.

In some embodiments, the component pane handling apparatus 20 includes one actuator 250. The actuator 250 or servomotor 250 can be coupled to the component pane capture element(s) 100, the displacement arm(s) 200, and/or the position control mechanism 300. The actuator 250 is configured for providing a drive-force for effectuating the displacement, translation, and/or rotation of the displacement arm(s) 200, and hence displacement and position of the component pane capture element(s) 100, based upon component pane size identified, sensed, detected, or determined by the position control mechanism 300. FIG. 8 shows a particular component pane handling apparatus 20 with one actuator 250 coupled to three displacement arms 200 and three component pane capture elements 100, wherein each displacement arm 200 carries one component pane capture element 100.

Figure 9:
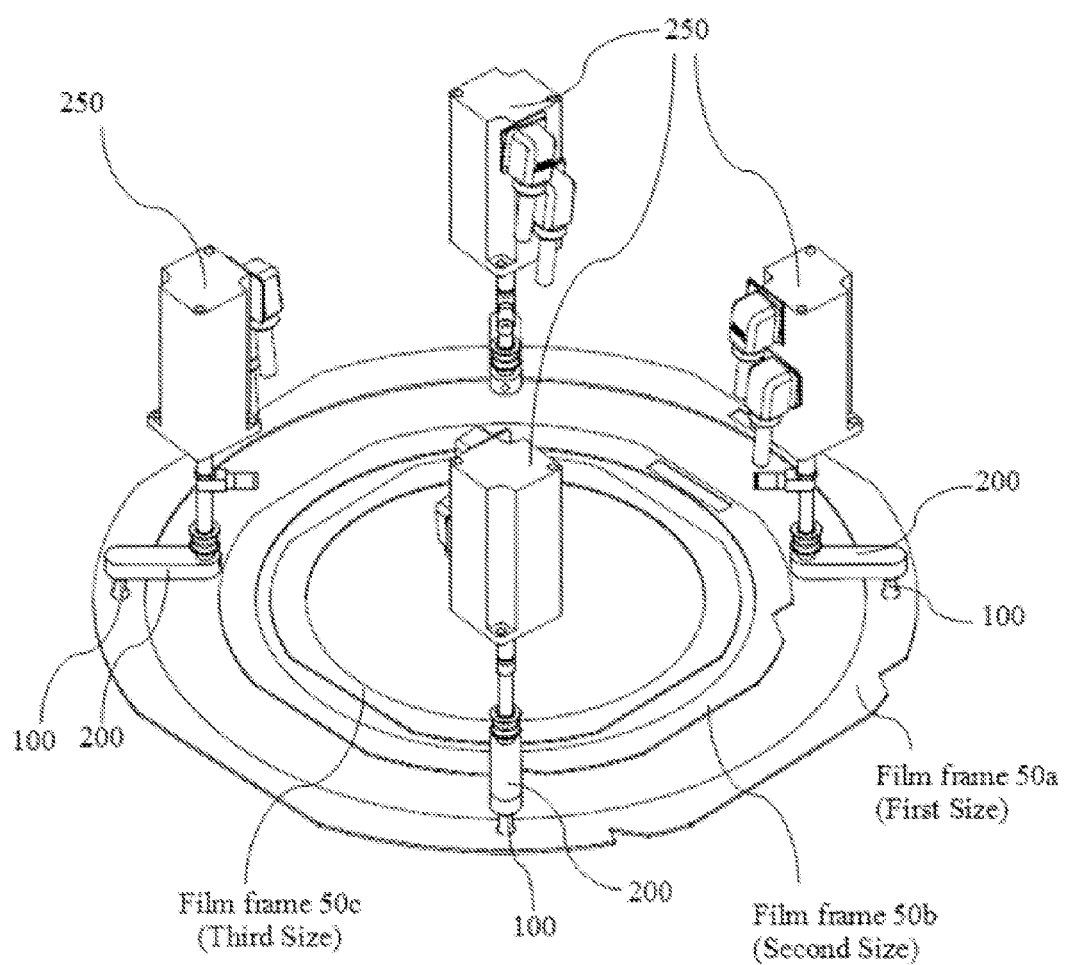
FIG. 9 shows a component pane handling apparatus that includes four actuators or motors, each actuator coupled to one displacement arm and configured to control and/or effectuate displacement of said displacement arm in accordance with an embodiment of the present disclosure.

In particular embodiments, for instance as shown in FIG. 9, the component pane handling apparatus 20 includes four actuators 250, wherein each actuator 250 is coupled to one displacement arm 200 of the component pane handling apparatus 20. Each actuator 250 can be configured to drive displacement, translation, and/or rotation of the displacement arm 200 that it is coupled to. Accordingly, each actuator 250 can be configured to drive or control displacement and position of the component pane capture element 100 carried by the displacement arm 200 that said actuator 250 is coupled to.

Where the component pane handling apparatus 20 includes a plurality of actuators 250, each actuator 250 coupled or connected to one particular displacement arm 200, the operation of each actuator 250 within the plurality of actuators 250 can be controlled in a manner that enables controlled, coordinated, synchronized, and/or simultaneous displacement, translation, and/or rotation of the plurality of displacement arms 200. In particular embodiments, the use of a plurality of actuators 250 enables or effectuates controlled, coordinated, synchronized, and/or simultaneous displacement, translation, and/or rotation of a corresponding plurality of displacement arms 200, and hence controlled, coordinated, synchronized, and/or simultaneous displacement and position of a plurality of component pane capture elements 100, without a need for use of the coupling structure 360 and/or the coupling modules 360.

The component pane handling apparatus 20 of various embodiments of the present disclosure is configured to be able to handle, capture, carry, hold, retrieve, and/or transfer component panes 50 (e.g., film frames 50) of multiple different sizes without need to disrupt or interrupt component pane handling apparatus operation by changing apparatus component panes as is commonly required by many conventional component pane handlers (e.g., film frame handlers). Therefore, the use of the component pane handling apparatus 20 can help to increase efficiency, ease, and/or cost effectiveness of component pane handling and/or transfer, for instance, in the semiconductor industry in association with handling and/or transfer of film frames 50.

In particular embodiments, the component pane handling apparatus 20 further includes sensor(s) (e.g., balancing sensor(s)) (not shown) configured to provide feedback or an indication as to whether a particular component pane 50 is accurately, properly, or appropriately carried, captured, and/or handled by the component pane handling apparatus 20. More specifically, the balancing sensor(s) can be configured to provide a user with feedback in relation to weight distribution, for instance accurate or balanced weight distribution, of the component pane carried, captured, and/or handled by the component pane handling apparatus 20. Suction force applied to the component pane 50 (e.g., film frame 50) can be controlled (e.g., selected and/or adjusted) in response to the feedback provided by the sensor(s) (e.g., balancing sensor(s)). When a particular component pane 50 is not accurately captured, an adjusted (e.g., an increased) suction force can be applied to the component pane 50 to one of effectuate or enhance accurate, proper, or appropriate carrying, capturing, and/or handling of the particular component pane 50.

When too much suction force is acting on a particular component pane 50, the suction force applied to the component pane 50 can be adjusted (e.g., decreased) to one of effectuate or enhance accurate, proper, or appropriate carrying, capturing, and/or handling of the particular component pane 50.

In particular embodiments, the component pane handling apparatus 20 includes or is coupled to a control unit (not shown) such as a computer system or device (e.g., a personal computer or a computer workstation) that is configured to cooperatively control the operation of the component pane handling apparatus 20 by way of executing stored program instructions (or computer program software instructions) that define or control at least one component pane handling, capturing, transferring, of holding in accordance with the present disclosure.

Aspects of Representative Process Embodiments

Figure 11:
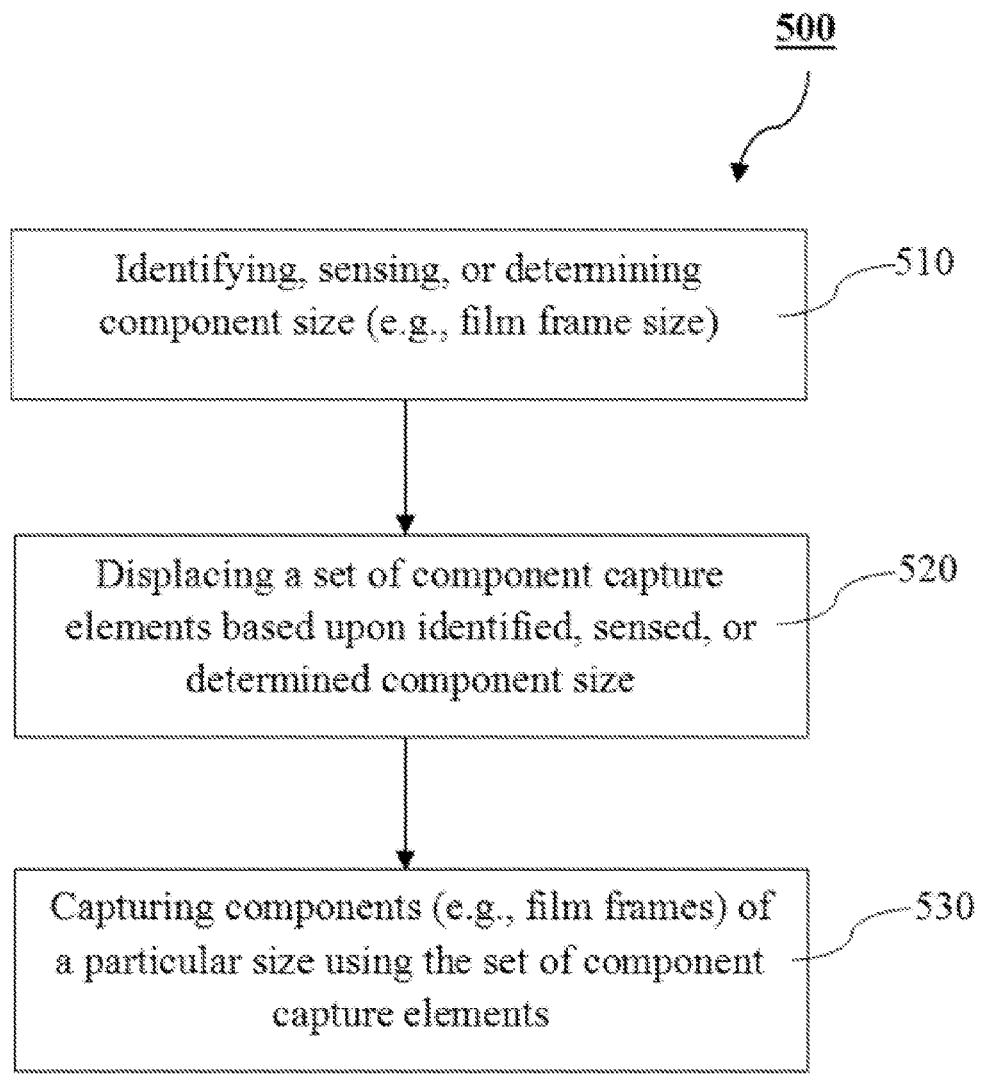
FIG. 11 is a flowchart of a process for handling component panes of multiple different sizes in accordance with an embodiment of the present disclosure.

FIG. 11 shows a flowchart of a process 500 for handling, capturing, carrying, holding, and/or transferring component panes 50 (e.g., film frames 50) of multiple different sizes by the component pane handling apparatus 20 according to an embodiment of the present disclosure.

As described above, the component pane handling apparatus 20 is configured or adapted to be able to handle, capture, hold, carry, retrieve, and/or transfer component panes 50, for example film frames 50, of multiple different sizes and/or shapes. In addition, the component pane handling apparatus 20 can be configured to handle, capture, hold, carry, retrieve, and/or transfer different types of component panes 50.

In many embodiments, the component pane handling apparatus 20 includes a plurality of component pane capture elements 100 that are displaceable between multiple different positions (e.g., the first position as shown in FIG. 3A, FIG. 5A and FIG. 5B; the second position as shown in FIG. 3B, FIG. 6A and FIG. 6B; and the third position as shown in FIG. 3C, FIG. 7A and FIG. 7B) for handling, capturing, holding, carrying, retrieving, and/or transferring component panes 50, more specifically film frames 50, of corresponding sizes (e.g., film frames 50a of the first size, film frames 50b of the second size, and film frames 50c of the third size respectively). In relation to film frames 50, the first size, the second size, and the third size can correspond to twelve inches, eight inches, and six inches respectively.

In a first process portion 510, a size and/or shape of particular component pane(s) 50, more specifically film frame(s) 50, is identified, positively indicated, determined, sensed, or detected.

In many embodiments, at least one of the manual control mechanism 320 (or manual adjustment mechanism 320) and the automatic control mechanism (or automatic adjustment mechanism) facilitates or effectuates the identification, positive indication, determination, sensing, or detection of the film frame size and/or shape.

The manual control mechanism 320 translates a user's input (e.g., user-provided or user-effectuated selection) into effectuation and/or control of displacement of at least one component pane capture element 100, and in many embodiments a plurality of component pane capture elements 100. As described above, the manual control mechanism 320 includes the control interface 325, the selector lever 330, and the selector guide 335. The user is able to displace or manipulate the selector lever 330 to one of the plurality of engagement markers 327 formed in the control interface. Each engagement marker 327 of the plurality of engagement markers 327 corresponds to a particular, predetermined, or specified position of the at least one component pane capture element 100, and in many embodiments the plurality of component pane capture elements 100. By selecting or determining which engagement marker 327 of the plurality of engagement markers 327 the selector lever 330 is engaged with, the user selects or determines the position of the at least one component pane capture element 100, and in many embodiments the plurality of component pane capture elements 100. This is also to say, by selecting or determining a particular engagement marker 327 of the plurality of engagement markers 327 to which the selector lever 330 is engaged as a result of user interaction or use input, the size of the component pane 50 (e.g., film frame 50) that the component pane handling apparatus 20 is to handle, capture, carry, hold, retrieve, and/or transfer is established, indicated, or determined.

The automatic control mechanism is configured to sense, detect, or determine component pane size in automatically, substantially automatically, or at least partly automatically. In various embodiments, the automatic control mechanism is coupled to the automatic sensing device configured to sense, detect, or determine component pane size and/or shape. The automatic sensing device can include at least one, and in many embodiments a plurality of, sensor or sensing elements. The automatic sensing device can be carried by the component pane handling apparatus 20; or disposed external to the component pane handling apparatus 20, for instance disposed at or carried by a component pane loading station or component pane storage station.

In most embodiments, the position of the plurality of component pane capture elements 100 is dependent upon the size of the component pane 50, more specifically film frame 50, that is to be handled, captured, carried, held, retrieved, and/or transferred by the component pane handling apparatus 20.

A second process portion 520 involves displacing the at least one component pane capture element 100, and in many embodiments the plurality of component pane capture elements 100, for positioning the at least one component pane capture element 100, and in many embodiments the plurality of component pane capture elements 100, at an intended or target position based upon the identified, sensed, detected, or determined component pane size (e.g., film frame size).

FIG. 5A and FIG. 5B show the position of the plurality of component pane capture elements 100 (i.e., four component pane capture elements 100) at the first position for enabling the handling of film frames 50a of the first size (i.e., twelve inches). FIG. 6A and FIG. 6B show the position of the plurality of component pane capture elements 100 at the second position for enabling the handling of film frames 50b of the second size (i.e., eight inches). FIG. 7A and FIG. 7B show the position of the plurality of component pane capture elements 100 at the third position for enabling the handling of film frames 50c of the third size (i.e., six inches).

The displacement of the at least one component pane capture element 100, and in many embodiments the plurality of component pane capture elements 100, can be facilitated, effectuated, and/or controlled by the position control mechanism 300. As described above, the position control mechanism 300 includes the manual control mechanism 320 and/or the automatic control mechanism, each of the manual control mechanism 320 and the automatic control mechanism configured to provide an identification or positive indication or determination of component pane size.

In several embodiments of the present disclosure, the displacement of the plurality of component pane capture elements 100 can be effectuated in a coordinated, substantially coordinated, or synchronized manner. For instance, in some embodiments, the connector belt 350 that interconnects or couples each displacement arm 200 of the plurality of displacement arms 200 as well as each component pane capture element 100 of the plurality of component pane capture elements 100 is configured to one of facilitate or effectuate said coordinated or at least substantially coordinated displacement, translation, and/or rotation of the plurality of displacement arms 200; and hence coordinated or at least substantially coordinated displacement and position of the plurality of component pane capture elements 100.

The component pane handling apparatus 20 can include actuator(s) 250 (e.g., electromechanical actuator(s) or servomotor(s)) for effectuating displacement of at least one displacement arm 200 of the plurality of displacement arms 200. In particular embodiments, the component pane handling apparatus 20 includes a plurality of actuators 250, each actuator 250 of the plurality of actuators 250 coupled to one displacement arm 200 of the plurality of displacement arms 200 to one of facilitate or effectuate controlled, coordinated, and/or synchronized displacement and position of the plurality of displacement arms 200, and hence plurality of component pane capture elements 100.

The displacement of the plurality of component pane capture elements 100 between a plurality of different positions enables positioning of the set of component pane capture elements 100 for handling, capturing, carrying, holding, retrieving, and/or transferring film frames 50 of a corresponding plurality of different sizes.

The displacement of the at least one component pane capture element 100, and in many embodiments the plurality of component pane capture elements 100, can be facilitated, effectuated, and/or controlled by the position control mechanism 300. In particular embodiments wherein the position control mechanism 300 includes the automatic control mechanism, the displacement of the at least one component pane capture element 100 can be controlled by a computer software program executed on a computing device (not shown) coupled to the component pane handling apparatus. Each component pane capture element 100 can be automatically moved according to a preset or pre-programmed computer software program.

In a third process portion, the at least one component pane capture element 100, and in many embodiments the plurality of component pane capture elements 100, is used for capturing, picking up, or retrieving component panes 50 (e.g., film frames 50) of the identified, sensed, detected, or determined size.

The plurality of component pane capture elements 100 can include, or can be, a plurality of vacuum or suction elements 100. The plurality of vacuum elements 100 is configured for applying a vacuum or suction force to the component pane 50 (e.g., film frame 50) for capturing, holding, carrying, retrieving, or securing the component pane 50 to the component pane handling apparatus 20. The initiation, termination, quantity, and/or duration of vacuum or suction force applied through the plurality of suction elements 100 can be controlled and/or varied as desired, for instance depending on the size of the component pane 50 (e.g., film frame 50) that is to be captured, carried, held, retrieved, and/or transferring by the component pane handling apparatus 20.

Although vacuum or suction force is disclosed for capturing, holding, or securing component panes 50 (e.g., film frames 50) to the component pane handling apparatus 20, it will be understood that other means, tools, or mechanisms capable of capturing, holding, or securing component panes 50 (e.g., film frames 50) to the component pane handling apparatus 20 can alternatively or additionally be used within the scope of the present disclosure. For instance, the component pane capture elements 100 can include or carry adhesive elements, gripper mechanisms, or magnetic attraction elements for facilitating or effectuating capture or hold of component panes 50 (e.g., film frames 50) to the component pane handling apparatus 20.

The component pane handling apparatus 20 that is carrying the component pane 50 (e.g., film frame 50) can be displaced, translated, and/or rotated for displacing or transferring the component pane 50 between different positions, locations, or system component panes or stations. As described above, the component pane handling apparatus 20 can include or be coupled to a displacement effector 30 configured to effectuate displacement, translation, and/or rotation of the component pane handling apparatus 20.

Embodiments of the present disclosure relate to apparatuses, devices, systems, processes, and/or methods for handling, capturing, holding, carrying, retrieving, and/or transferring components, for example semiconductor components such as film frames, electrical components such as printed circuit boards (PCBs), and solar cells or panels, of multiple different sizes. The apparatus includes at least one component pane capture element, and in many embodiments a plurality of component pane capture elements (e.g., two, three, four, or more component pane capture elements), which are displaceable between a number of different positions, each position corresponding to a particular component pane size. The position of the component pane capture element(s) at different predetermined, specified, or designated positions enables capture of component panes of corresponding sizes.

The displacement and position of the component pane capture element(s) is controlled by the position control mechanism. The position control mechanism can include a manual control mechanism and/or an automatic control mechanism. The manual control mechanism is configured to receive a user-provided or user-effectuated input, which identifies, indicates, or determines component pane size; and translate said user-provided input for effectuating and/or controlling displacement and position of the component pane capture element(s). The automatic control mechanism is configured to automatically or at least substantially automatically sense, detect, or determine component pane size; and effectuate or and/or control displacement and position of the component pane capture element(s) based upon sensed, detected, and/or determined component pane size.

The ability of the apparatus (i.e., component pane handling apparatus) of various embodiments of the present disclosure for handling, capturing, holding, carrying, retrieving, and/or transferring component panes of multiple different sizes removes a need to disrupt, interrupt, or stop the operation of said apparatus between the capture of component panes of a first size and the capture of component panes of a second size. Conventional component pane handling apparatus (e.g., conventional film frame handlers) are not capable of handling, capturing, carrying, retrieving, and/or transferring component panes of different sizes without a need to disrupt or stop operation thereof for changing apparatus component panes to adapt said conventional component pane handling apparatus for handling, capturing, carrying, retrieving, and/or transferring component panes of different sizes. Accordingly, various embodiments of the present disclosure can be more efficient or effective in handling component panes that can exhibit multiple sizes and/or shapes (e.g., with respect to a plurality of likely, predetermined, or standard component sizes or shapes), more cost-effective, and/or simpler in construction and manufacture than prior systems, apparatuses, devices, or techniques for handling component panes.

In addition to embodiments such as those described above, certain embodiments in accordance with the present disclosure can have a different structural configuration while providing identical, essentially identical, or analogous capabilities with respect to handling components that can exhibit a plurality of different sizes and/or shapes. For instance, an embodiment can include a plurality of component pane capture elements that are coupled to a resilient biasing structure, device, or mechanism having one or more spring elements that are configured to dispose component pane capture elements apart from each other in accordance with a first or default position. An automatic control mechanism such as an actuator or servomotor can be configured to selectively or programmably apply forces (e.g., in response to a detected or determined component pane size and/or user input) that act upon or against such spring elements in order to transition or translate the component pane capture elements from the first or default position to a second position, a third position, and/or one or more other positions, where the second, third, and other positions can dispose the component pane capture elements closer to each other than when the component pane capture elements are disposed in the first position. The first, second, third, and other positions correspond to different component pane sizes or shapes.

Particular embodiments of the disclosure are described above for addressing at least one of the previously indicated problems. While features, functions, advantages, and alternatives associated with certain embodiments have been described within the context of those embodiments, other embodiments may also exhibit such advantages, and not all embodiments need necessarily exhibit such advantages to fall within the scope of the disclosure. It will be appreciated that several of the above-disclosed structures, features and functions, or alternatives thereof, may be desirably combined into other different devices, systems, or applications. The above-disclosed structures, features and functions, or alternatives thereof, as well as various presently unforeseen or unanticipated alternatives, modifications, variations or improvements thereto that may be subsequently made by one of ordinary skill in the art, are encompassed by the following claims.

The invention claimed is:

1. An apparatus comprising:
    a plurality of displacement arms, wherein
        each displacement arm having at least one component pane capture element located on its length, the at least one component pane capture element is configured to handle a component pane,
        the plurality of displacement arms is displaceable between a plurality of sets of pre-determined positions, each set of the plurality of sets of pre-determined positions corresponding to a component pane of different shape and/or size, and
    wherein a change in displacement position of the plurality of displacement arms to a set of pre-determined positions amongst the plurality of sets of pre-determined positions depends on shape and/or size of the component pane to be handled; and
    a position control mechanism suitably coupled to the plurality of displacement arms, the position control mechanism is configurable to control the displacement of the plurality of displacement arms to the set of pre-determined positions from amongst the plurality of sets of pre-determined positions, corresponding to the shape and size of the component pane to be handled,
    wherein said displacement of the plurality of displacement arms results in the displacement of the at least one component pane capture element thereon to the set of pre-determined positions for capture and handling of the component pane.

2. The apparatus as in claim 1, wherein each of the at least one component pane capture element of each of the plurality of displacement arms is fluidly coupled to at least one vacuum source and is configured to apply a vacuum force to a top surface of a component pane to facilitate handling of the component pane when the at least one vacuum source is activated.

3. The apparatus as in claim 2, wherein the at least one component pane capture element is displaceable between a plurality of positions along the length of each of the plurality of displacement arms for capture and handling component panes of different shape and/or size.

4. The apparatus as in claim 3, wherein the displacement arm of each of the plurality of displacement arms includes at least one other interconnected segment having at least one component pane capture element thereon.

5. The apparatus as in claim 4, wherein the position control mechanism comprises a manual position control mechanism suitably coupled to the plurality of displacement arms, the manual position control mechanism is manually configurable by user input to control and effectuate the synchronous displacement of the plurality of displacement arms to a selected set of pre-determined positions from amongst the plurality of sets of pre-determined positions, for capture of the component pane corresponding to a selected component pane shape and/or size.

6. The apparatus as in claim 5, wherein the manual position control mechanism comprises:
a belt that couples the manual position control mechanism to a plurality of coupling structures which are in turn suitably coupled to the plurality of displacement arms;
a selection interface having a plurality of engagement markers, each of the plurality of engagement markers representing a different selection of component pane shape and/or size; and
a selector lever that is displaceable relative to the selection interface and configured to engage with each of the plurality of engagement markers depending on user selection,
wherein manual engagement of the selector lever to any one selection of the plurality of engagement markers drives displacement of the belt by a pre-determined distance that corresponds to displacement of the plurality of displacement arms to a set of pre-determined positions from amongst a plurality of sets of pre-determined positions, for capture of the component pane that corresponds to the selected component pane shape and/or size.

7. The apparatus as in claim 4, wherein:
the position control mechanism is automatic and comprises at least one actuator suitably coupled to at least one of a plurality of coupling structures, each of said plurality of coupling structures is coupled by a means of a belt; and
wherein the at least one actuator, when activated, is configured to rotate a coupling structure to drive the belt to simultaneously or otherwise displace each of the plurality of displacement arms to the set of pre-determined positions from amongst the plurality of sets of pre-determined positions, for capture of the component pane corresponding to the selected component pane shape and/or size.

8. The apparatus as in claim 4, wherein:
the position control mechanism is automatic and comprises a plurality of actuators, each of the plurality of actuators is coupled to each of the plurality of coupling structures, said coupling structures is coupled to each of the plurality of displacement arms; and
wherein the plurality of actuators is configurable to be activated to simultaneously or otherwise displace each of the plurality of displacement arms to the second set of pre-determined positions from amongst the plurality of sets of pre-determined positions, for capture of the component pane corresponding to the selected component pane shape and/or size.

9. The apparatus as in claim 7 or 8, wherein:
the selection or determination of shape and/or size of the component pane to be handled by the position control mechanism is automatic and enabled by an automatic sensing or detection device configurable (a) to sense or detect the shape and/or size of the component pane presented for handling and (b) to communicate an appropriate signal to a processing unit; and
wherein the processing unit thereafter communicates appropriate control signals or actuation commands to the position control mechanism to displace each of the plurality of displacement arms to a set of pre-determined positions that correspond to the shape and/or size of the component pane sensed or detected.

10. The apparatus as in claim 9, wherein the automatic sensing or detection device comprises at least one sensor or sensing element disposed on the component pane handling apparatus or disposed external to the component pane handling apparatus.

11. The apparatus as in claim 10, wherein sensing of presence, shape, and/or size of a component pane presented for handling and the displacement of the plurality of displacement arms to a set of pre-determined positions from amongst a plurality of sets of pre-determined position to handle said component pane is operated and controlled by software executable by a processing unit.

12. An apparatus comprising:
a plurality of displacement arms, wherein
each displacement arm having at least one component pane capture element located on its length, the at least one component pane capture element is configured to capture a component pane, wherein a relative spatial positioning between the at least one component pane capture element of the plurality of displacement arms is dependent on at least one physical characteristic of a component pane to be handled, the physical characteristic including at least one of shape, radius, diameter, and planar surface area,
the plurality of displacement arms is displaceable between a plurality of sets of pre-determined positions, each set of the plurality of sets of pre-determined positions corresponding to a component pane of different shape and/or size; and
a position control mechanism suitably coupled to the plurality of displacement arms, the position control mechanism is configurable to control a displacement of the plurality of displacement arms to a set of pre-determined positions from amongst the plurality of sets of pre-determined positions, corresponding to the shape and size of a component pane to be handled,
wherein said displacement of the plurality of displacement arms results in the displacement of the at least one component pane capture element thereon to the set of pre-determined positions for capture and handling of the component pane of a corresponding pre-determined shape and size.

13. The apparatus as in claim 12, wherein relative spatial positioning of the plurality of displacement arms between a plurality of sets of pre-determined positions is dependent on the diameters of a plurality of standard industry sized component panes.

14. The apparatus as in claim 12 or 13, wherein the apparatus includes:
   at least one sensor element coupled to each component pane capture element, each of the at least one sensor element configured to provide a feedback signal to a processing unit corresponding to a weight distribution of a component pane to be handled when engaged with a surface of said component pane at the set of pre-determined positions; and
   wherein the processing unit configured to provide a signal to at least one vacuum source fluidly coupled to each of the at least one component pane capture element to adjust a suction force to be applied to the component pane at each position of the set of predetermined positions.

15. The apparatus as in claim 14, wherein the operation of the sensor to provide the feedback signal is controlled by software executable by a processing unit.

16. The apparatus as in claim 1, wherein the at least one component pane capture element comprises at least one of an adhesive element, a gripping element, and a capture element configured to capture a component pane.

17. The apparatus as in claim 1, wherein the at least one component pane capture element comprises a magnetic element configured to apply an attractive force to at least a portion of a component pane to thereby facilitate the capturing or handling of the component pane by the apparatus.

18. The apparatus as in any of claim 1-8, 12-13 or 16-17, wherein the component pane comprises one of a film frame, a semiconductor wafer, a portion of a semiconductor wafer, a solar wafer panel, a solar cell panel, or an electronic device package in which circuit elements reside.

19. The apparatus as in claim 18, wherein the at least one of capture, displacement, conveyance, and release of a component pane between a first operation station and another operation station relative to the apparatus is controlled by software executable by a processing unit.

20. A method for handling component panes comprising:
   presenting a component pane for handling;
   selecting a shape and/or size of the component pane to be handled;
   activating a position control mechanism configured to move a plurality of displacement arms coupled to the position control mechanism, wherein
      each displacement arm having at least one component pane capture element,
      the plurality of displacement arms is displaceable between a plurality of sets of pre-determined positions, each set of the plurality of sets of pre-determined positions corresponding to a component pane of different shape and/or size, and wherein a change in displacement position of the plurality of displacement arms to a set of pre-determined positions amongst the plurality of sets of pre-determined positions depends on shape and/or size of the component pane to be handled; and
   displacing the plurality of displacement arms to the set of predetermined positions facilitates relative displacement and position of the component pane capture element to handle the component pane of the shape and/or size selected before activation of the vacuum source to enable pick up of the selected component pane.

21. The method as in claim 20, wherein selecting the shape and/or size of the component pane to be handled occurs by way of user input.

22. The method as in claim 21, wherein the user input comprises:
   manual disposition of a selector lever relative to one of a plurality of engagement markers on a selection interface of a manual position control mechanism; and
   wherein the manual position control mechanism is configured to translate the user input into a simultaneous displacement of the plurality of displacement arms to the set of pre-determined positions corresponding to the selected component pane shape and/or size.

23. The method as in claim 20 wherein selecting the shape and/or size of the component pane is automated by way of at least one automatic sensing or detection device.

24. The method as in claim 23, wherein:
   the at least one automatic sensing or detection device is configured to automatically sense at least one of presence, shape, and size of a component pane when a component pane is presented, the automatic sensing or detection device is configured to communicate a signal to a processing unit; and
   wherein the processing unit is configured to communicate a command signal to the position control mechanism to automatically displace the plurality of displacements arms to a set of pre-determined positions corresponding to a sensed or detected component pane shape and/or size.

25. The apparatus as in claim 20 wherein the change in displacement position of the plurality of displacement arms comprises a change from a first set of pre-determined positions correspond to a first shape and/or size of a first component pane to a second set of pre-determined positions correspond to a second shape and/or size of a second component pane.

* * * * *